US012805326B2

(12) United States Patent
Lee et al.

(10) Patent No.: US 12,805,326 B2
(45) Date of Patent: Nov. 17, 2026

(54) SEMICONDUCTOR CHIP AND MANUFACTURING METHOD THEREOF

(71) Applicant: Taiwan Semiconductor Manufacturing Company, Ltd., Hsinchu (TW)

(72) Inventors: Szu-Hsien Lee, Tainan City (TW); Yun-Chung Wu, Taipei City (TW); Pei-Wei Lee, Pingtung County (TW); Fu Wei Liu, Tainan (TW); Jhao-Yi Wang, Tainan (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 963 days.

(21) Appl. No.: 18/161,778

(22) Filed: Jan. 30, 2023

(65) Prior Publication Data

US 2024/0120295 A1 Apr. 11, 2024

Related U.S. Application Data

(60) Provisional application No. 63/413,601, filed on Oct. 5, 2022.

(51) Int. Cl.

| | |
|---|---|
| ***H10W 42/00*** | (2026.01) |
| ***H10P 14/40*** | (2026.01) |
| ***H10W 72/00*** | (2026.01) |
| ***H10W 72/20*** | (2026.01) |
| ***H10W 72/90*** | (2026.01) |

(52) U.S. Cl.

CPC ............ *H10W 42/00* (2026.01); *H10P 14/40* (2026.01); *H10P 14/412* (2026.01); *H10P 14/418* (2026.01); *H10W 42/121* (2026.01); *H10W 72/012* (2026.01); *H10W 72/227* (2026.01); *H10W 72/232* (2026.01); *H10W 72/234* (2026.01); *H10W 72/244* (2026.01); *H10W 72/248* (2026.01); *H10W 72/261* (2026.01); *H10W 72/263* (2026.01); *H10W 72/267* (2026.01); *H10W 72/9223* (2026.01); *H10W 72/9226* (2026.01); *H10W 72/942* (2026.01); *H10W 72/952* (2026.01); *H10W 72/90* (2026.01); *H10W 72/923* (2026.01)

(58) Field of Classification Search

CPC ............ H10W 72/012; H10W 72/227; H10W 72/232; H10W 72/234; H10W 72/244; H10W 72/248; H10W 72/261; H10W 72/263; H10W 72/267; H10W 72/9223; H10W 72/9226; H10W 72/942; H10W 72/952; H10W 42/121; H10P 14/412; H10P 14/418

See application file for complete search history.

*Primary Examiner* — Marcos D. Pizarro

(74) *Attorney, Agent, or Firm* — JCIPRNET

(57) ABSTRACT

A semiconductor chip and a manufacturing method thereof are provided. The semiconductor chip includes: an array of pillar structures, disposed on a front surface of the semiconductor chip, and respectively including a ground pillar and multiple working pillars laterally spaced apart from and substantially parallel with a line portion of the ground pillar; and dummy pillar structures, disposed on the front surface of the semiconductor chip and laterally surrounding the pillar structures. Active devices formed inside the semiconductor chip are electrically connected to the working pillar. The ground pillars of the pillar structures and the dummy pillar structures are electrically connected to form a current pathway on the front surface of the semiconductor chip.

20 Claims, 24 Drawing Sheets

SEMICONDUCTOR CHIP AND MANUFACTURING METHOD THEREOF

CROSS-REFERENCE TO RELATED APPLICATION

This application claims the priority benefit of U.S. provisional application Ser. No. 63/413,601, filed on Oct. 5, 2022. The entirety of the above-mentioned patent application is hereby incorporated by reference herein and made a part of this specification.

BACKGROUND

For some particular applications, pillar structures are deployed as an array at an outer surface of a semiconductor chip. Ideally, uniformity of the pillar structures is perfect, and some of the pillar structures close to a boundary of the array are identical with others of the pillar structure in a central region of the array. However, actual manufacturing process may have certain uniformity issue, which may result in difference between the pillar structures close to the boundary of the array and the pillar structures in the central region of the array. Measures for improving uniformity of the pillar structure are required.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
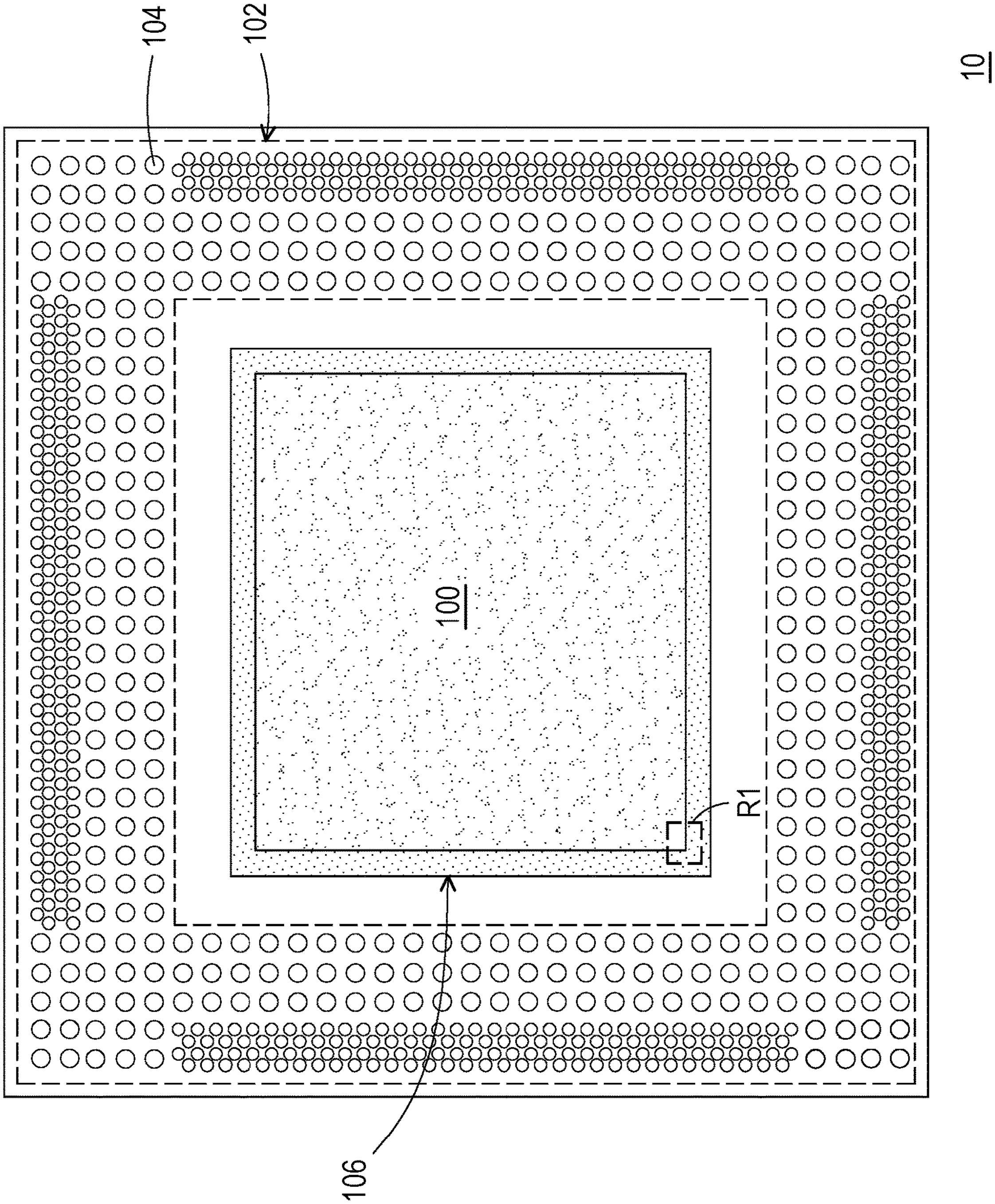
FIG. 1A is a schematic plan view illustrating a front surface of a semiconductor chip, according to some embodiments of the present disclosure.

The following disclosure provides many different embodiments or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A is a schematic plan view illustrating a front surface of a semiconductor chip 10 according to some embodiments of the present disclosure.

Referring to FIG. 1A, the semiconductor chip 10 may have a central device region 100 and a peripheral input/output (I/O) region 102 extending along edges of the semiconductor chip 10. As will be further described, pillar structures (not shown in FIG. 1A) are exposed at a front surface of the central device region 100, and active devices (also not shown) may be formed in the central device region 100 and overlapped with the pillar structures. On the other hand, electrical connectors 104 may be deployed on a front surface of the peripheral I/O region 102. The electrical connectors 104 may be functioned as I/O terminals of the semiconductor chip 10.

Further, the semiconductor chip 10 may also have a dummy region 106 laterally enclosing the central device region 100 and defined between the central device region 100 and the peripheral I/O region 102. As will be further described, dummy pillar structures (not shown in FIG. 1A) are disposed on a front surface of the dummy region 106. By disposing the dummy pillar structures, peripheral ones of the pillar structures within the device region 100 may be no longer located at an interface between a high density pattern region and a low density pattern region. Instead, comparable pattern density could be obtained at both of an outer side and an inner side of these peripheral pillar structures. As a result of reducing the pattern density variation, loading effect can be minimized, and the pillar structure within the device region 100 can be formed with significantly improved uniformity.

Figure 1B:
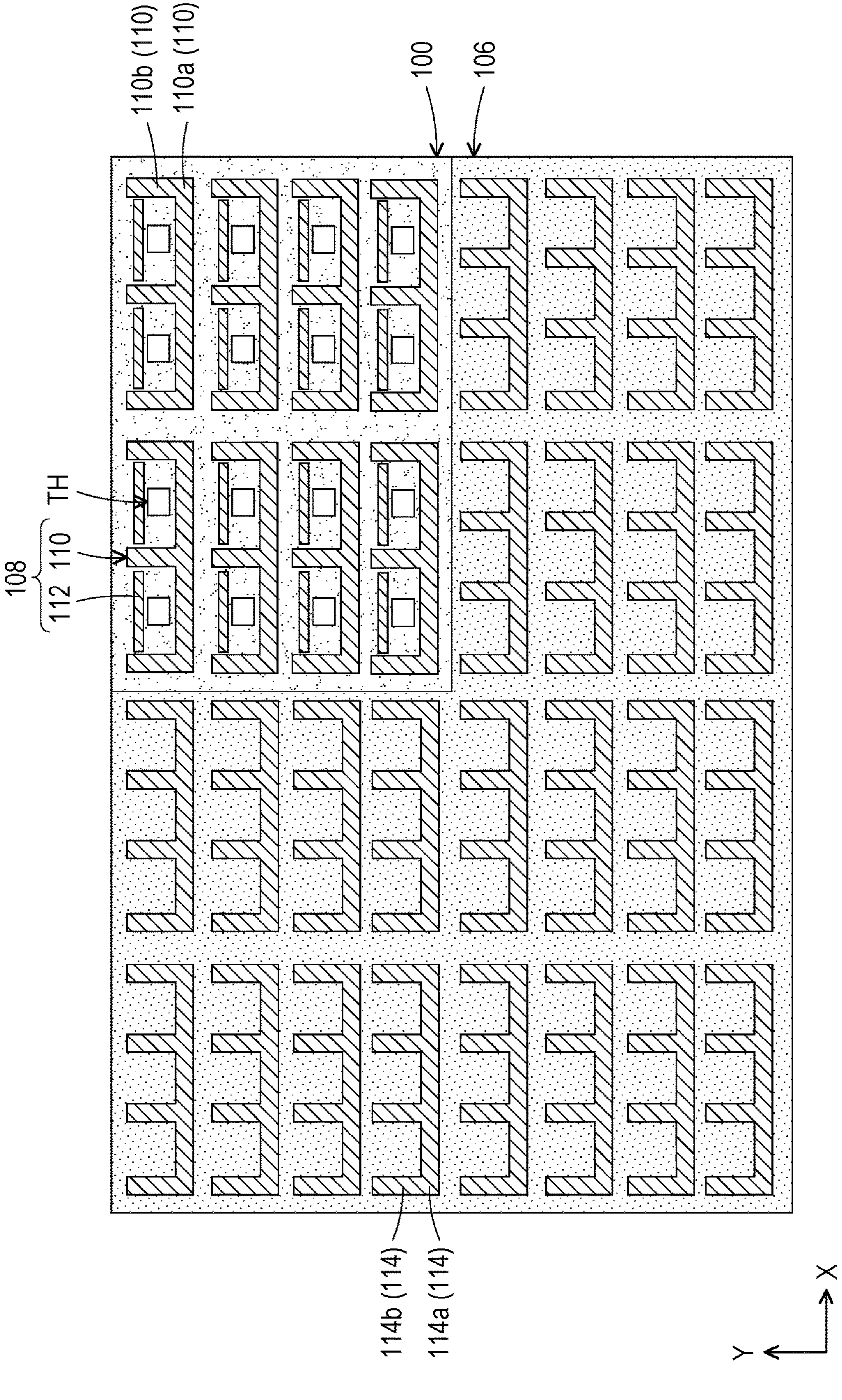
FIG. 1B is an enlarged schematic plan view of an area R1 shown in FIG. 1A.

FIG. 1B is an enlarged schematic plan view of an area R1 shown in FIG. 1A.

Referring to FIG. 1B, pillar structures 108 are disposed within the device region 100. The pillar structures 108 are arranged along rows and columns, and respectively include a ground pillar 110 and multiple working pillars 112. The ground pillars 110 are electrically connected to form a current pathway on the front surface of the semiconductor chip 10, while the working pillars 112 are electrically connected to the active devices (not shown) buried in the device region 100. Further, through holes TH extending through the device region 100 from the front surface of the semiconductor chip 10 to a back surface of the semiconductor chip 10 are respectively formed between one of the working pillars 112 and an adjacent ground pillar 110. For some applications, electron beams may be directed through the through holes TH. Paths of the electron beams passing the through holes TH may be controlled by the working pillars 112 receiving working voltages provided by the active devices.

In some embodiments, the ground pillar 110 in each pillar structure 108 has a line portion 110*a* extending along a first direction X, and has multiple laterally protruding portions 110*b* separately extending along a second direction Y from a single side of the line portion 110*a*. The second direction Y is intersected with (e.g., substantially perpendicular with) the first direction X. In some embodiments, each ground pillar 110 includes three laterally protruding portions 110*b* connected to the line portion 110*a*, and are spaced apart from one another. In these embodiments, two of the through holes TH are disposed between the three laterally protruding portions 110*b* of each ground pillar 110.

In some embodiments, the working pillars 112 of each pillar structure 108 are substantially parallel with the line portion 110*a* of the ground pillar 110 in the same pillar structure 108, and are separated from each other. Further, each of the working pillars 112 extends between and spaced apart from two laterally protruding portions 110*b* of the ground pillar 110 in the same pillar structure 108. According to such configuration, the through holes TH are each arranged within an area laterally surrounded by a working pillar 112 and a line portion 110*a* as well as two laterally protruding portions of a ground pillar 110. In those embodiments where the ground pillar 110 of each pillar structure 108 has three laterally protruding portions 110*b*, two of the through holes TH are laterally surrounded by each pillar structure 108.

On the other hand, dummy pillar structures 114 are deployed within the dummy region 106 for improving uniformity of the pillar structures 108 in the device region 100. The dummy pillar structures 114 are electrically connected with the ground pillars 110 of the pillar structures 108 within the device region 100, to form a current pathway on the front surface of the semiconductor chip 10. As similar to the ground pillars 110 of the pillar structures 108, the dummy pillar structures 114 respectively include a line portion 114*a* extending along the first direction X, and include multiple laterally protruding portions 114*b* separately extending along the second direction Y from a single side of the line portion 114*a*. As a difference, an amount of the laterally protruding portions 114*b* of each dummy pillar structure 114 may be greater than an amount of the laterally protruding portions 110*b* of each ground pillar 110. In those embodiments where each ground pillar 110 has three laterally protruding portions 110*b*, each dummy pillar structure 114 may have four or more (e.g., four to eight) laterally protruding portions 114*b*. As the dummy region 106 is defined at an interface between a high pattern density region (i.e., the device region 100) and a low pattern density region (i.e., an open region between the dummy region 106 and the peripheral I/O region 102), the dummy region 106 may be susceptible to pattern non-uniformity and/or pattern damages as a result of loading effect. That is, the dummy pillar structures 114 are sacrificial to the pattern non-uniformity and/or pattern damages for the pillar structures 108 in the device region 100, such that the pillar structures 108 can be formed with significantly improved uniformity. For instance, possible pattern damages of the dummy pillar structures 114 may include pillar collapse. The collapsed dummy pillar structures may be identified as defects during manufacturing, and yield of the semiconductor chip 10 may be affected by these defects. By increasing the amount of the laterally protruding portions 114*b* of the dummy pillar structures 114 (as compared to the pillar structures 108), contact area between the dummy pillar structures 114 and the front surface of the semiconductor chip 10 can be increased, thus the dummy pillar structures 114 are much less subjected to pillar collapse. Therefore, yield of the semiconductor chip 10 can be effectively improved.

In some embodiments, the dummy pillar structures 114 may not include working pillars (as similar to the working pillars 112 of the pillar structures 108), and the dummy region 106 may not have to be formed with active devices for providing working voltages to these working pillars. Further, as a difference from the device region 100, the dummy region 106 may be free of through holes penetrating through the semiconductor chip 10. That is, the through holes TH may be limited within the device region 100.

In some embodiments, the dummy pillar structures 114 are arranged along rows and columns of the pillar structures 108, such that the pillar structures 108 and the dummy pillar structures 114 form an array as an expansion of the array of the pillar structures 108. As an example, some of the dummy pillar structures 114 are arranged as four rows at a first side of the array of the pillar structures 108 (e.g., the bottom side of the array of the pillar structures 108 as show in FIG. 1B), and others of the dummy pillar structures 114 are arranged as two columns at a second side of the array of the pillar structures 108 (e.g., the left side of the array of the pillar structures 108 as shown in FIG. 1B). Although not shown, as similar to the first side of the array of the pillar structures 108, a third side of the array of the pillar structures 108 opposite to the first side may be lined with four rows of the dummy pillar structures 114. Further, although not shown, a fourth side of the array of the pillar structures 108 opposite to the second side may be lined with two columns of the dummy pillar structures 114, as similar to the second side of the array of the pillar structures 108. According to some embodiments, a ratio of an amount of the dummy pillar structures 114 with respect to an amount of the pillar structures 108 is about 0.04.

Figure 1C:
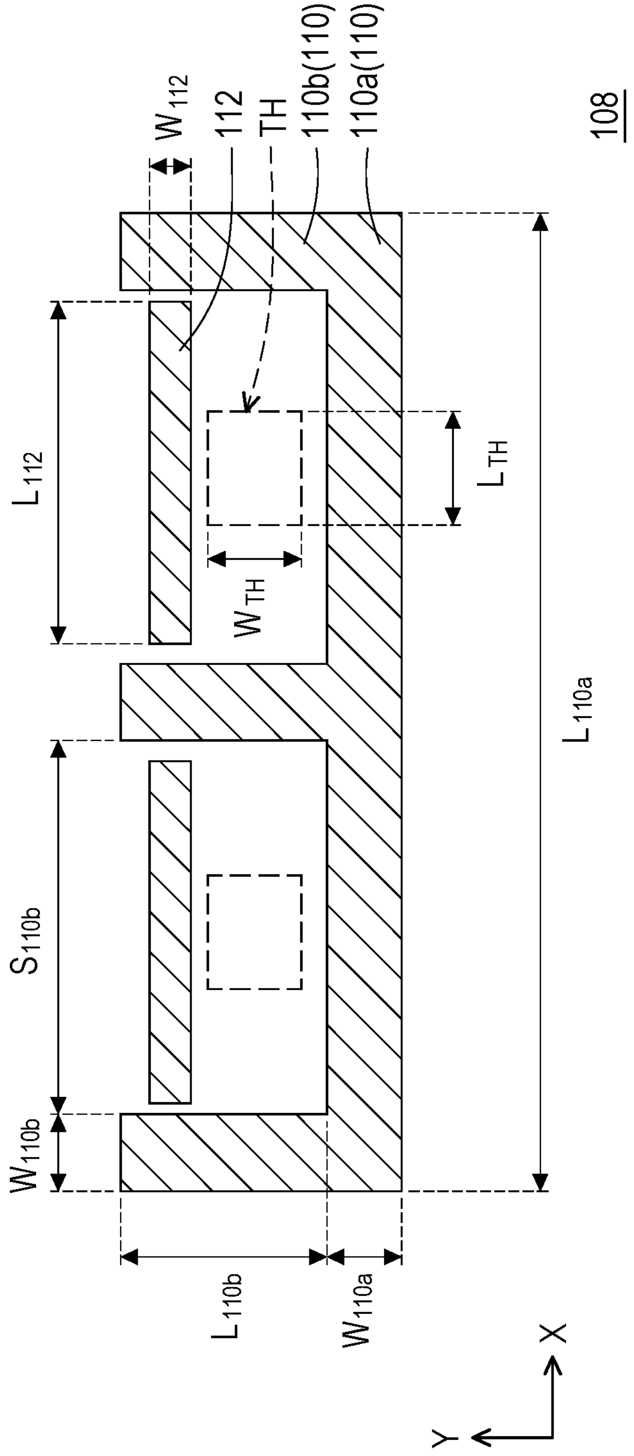
FIG. 1C is an enlarged schematic plan view of a pillar structure in a device region of the semiconductor chip, according to some embodiments of the present disclosure.

FIG. 1C is an enlarged schematic plan view of one of the pillar structures 108 in the device region 100, according to some embodiments of the present disclosure.

Referring to FIG. 1C, in some embodiments, a length $L_{110a}$ of the line portion 110*a* of the ground pillar 110 is equal to or less than about 7.5 times of a length $L_{110b}$ of the laterally protruding portions 110*b* of the ground pillar 110. In addition, in some embodiments, a width $W_{110a}$ of the line portion 110*a* of the ground pillar 110 is about the same as a width $W_{110b}$ of the laterally protruding portions 110*b* of the ground pillar 110. Further, a spacing $S_{110b}$ between adjacent laterally protruding portions 110*b* of the ground pillar 110 is dependent on the length $L_{110a}$ of the line portion 110*a* of the ground pillar 110, the width $W_{110b}$ of the laterally protruding portions 110*b* of the ground pillar 110 and how many of the laterally protruding portions 110*b* does the ground pillar 110 include. As an example, the length $L_{110a}$ may be equal to or greater than about 30 μm; the length $L_{110b}$ is greater than 0 and may be no greater than about 4 μm; and the width $W_{110a}$,$W_{110b}$ may each range from about 1 μm to about 2 μm.

Locations and dimensions of the working pillars 112 are dependent on dimensions and pattern design of the ground pillars 110. As shown in FIG. 1C, the working pillars 112 are located within lateral recesses defined by the line portion 110*a* and the laterally protruding portions 110*b* of the ground pillar 110, and are separated from the line portion 110*a* and the laterally protruding portions 110*b* of the ground pillar 110. A length $L_{112}$ of the working pillars 112 is shorter than the spacing $S_{110b}$ between the laterally protruding portions 110*b* of the ground pillar 110, and a width $W_{112}$ of the working pillars 112 is shorter than the length $L_{110b}$ of the laterally protruding portions 110*b* of the ground pillar 110. In some embodiments, a ratio of the length $L_{112}$ with respect to the width $W_{112}$ ranges from about 2.7 to about 4.2. As an example, the length $L_{112}$ may range from about 9.5 μm to about 10.5 μm, while the width $W_{112}$ may range from about 2.5 μm to about 3.5 μm.

Furthermore, dimensions of each through hole TH laterally surrounded by one of the working pillars 112 and the line portion 110*a* as well as adjacent ones of the laterally protruding portions of the ground pillar 110 in one of the pillar structures 108 are dependent on dimensions of the working pillars 112 and the ground pillar 112, as well as a spacing between the working pillars 112 and the line portion 110*a* of the ground pillar 110. In some embodiments, a ratio of a length $L_{TH}$ of the through holes TH (along the first direction X) with respect to a width $W_{TH}$ of the through holes TH (along the second direction Y) ranges from about 5.6 to about 8. As an example, the length $L_{TH}$ may range from about 45 μm to about 50 μm, whereas the width $W_{TH}$ may range from about 6.2 μm to about 8.0 μm.

Figure 1D:
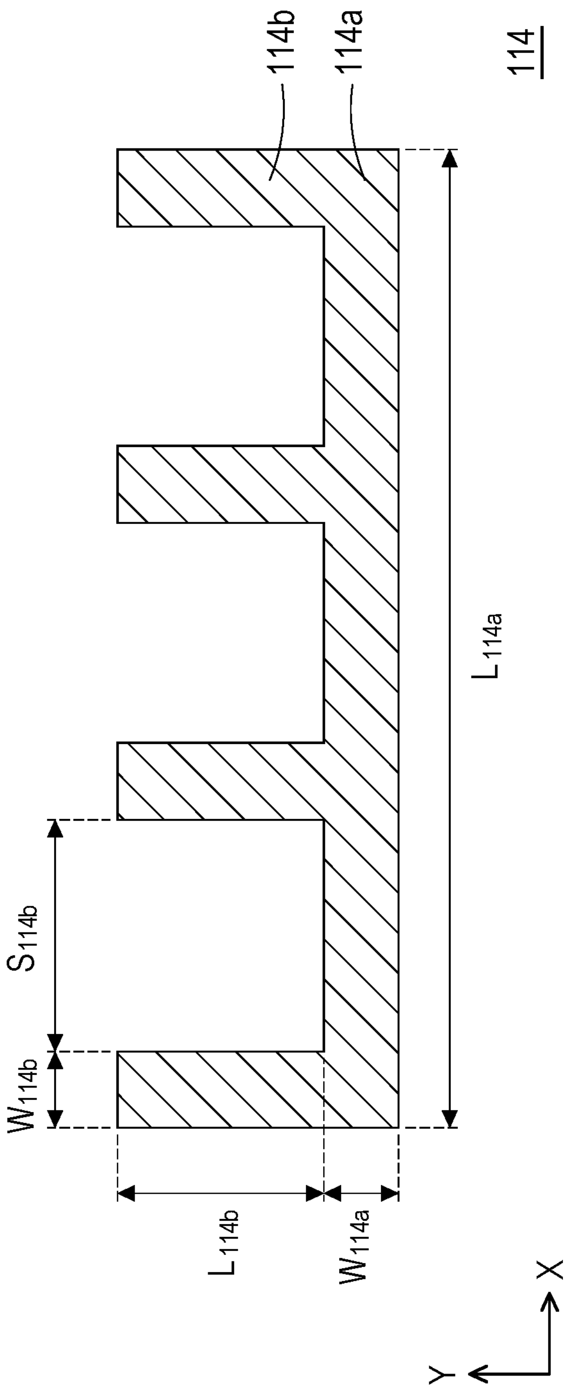
FIG. 1D is an enlarged schematic plan view of a dummy pillar structure in a dummy region of the semiconductor chip, according to some embodiments of the present disclosure.

FIG. 1D is an enlarged schematic plan view of one of the dummy pillar structures 114 in the dummy region 106, according to some embodiments of the present disclosure.

According to some embodiments, a length $L_{114a}$ and a width $W_{114a}$ of the line portion 114*a* of each dummy pillar structure 114 are substantially identical with the length $L_{110a}$ and the width $W_{110a}$ of the line portion 110*a* of the ground pillar 110 in each pillar structure 108, respectively. Alternatively, the length $L_{114a}$ and the width $W_{114a}$ may be different from the length $L_{110a}$ and the width $W_{110a}$, respectively. As an example, the length $L_{114a}$ may be equal to or greater than about 30 μm, whereas the width $W_{114a}$ may range from about 1 μm to about 2 μm.

Similarly, a length $L_{114b}$ and a width $W_{114b}$ of the laterally protruding portions 114*b* of each dummy pillar structure 114 may be substantially identical with or different from the length L110*b* and the width W110*b* of the laterally protruding portions 110*b* of the ground pillar 110 in each pillar structure 108, respectively. As an example, the length $L_{114b}$ may is greater than 0 and may be no greater than 4 μm, whereas the width $W_{114b}$ may range from about 1 μm to about 2 μm.

A spacing $S_{114b}$ between adjacent ones of the laterally protruding portions 114*b* of each dummy pillar structure 114 is dependent on dimensions of the line portion 114*a* and the laterally protruding portions 114*b* of each dummy pillar structure 114, as well as an amount of the laterally protruding portions 114*b* does each dummy pillar structure 114 have. As the amount of the laterally protruding portions 114*b* of each dummy pillar structure 114 may be greater than the amount of the laterally protruding portions 110*b* of the ground pillar 110 in each pillar structure 108, the spacing $S_{114b}$ between adjacent ones of the laterally protruding portions 114*b* of each dummy pillar structure 114 may be shorter than the spacing $S_{110b}$ between adjacent ones of the laterally protruding portions 110*b* of the ground pillar 110 in each pillar structure 108. In some embodiments, the spacing $S_{114b}$ is equal to or greater than about 2 μm.

Moreover, it should be noted that, although each corner of the ground pillars 110, the working pillars 112, the through holes TH and the dummy pillars 114 is depicted as an orthogonal corner in FIG. 1B, FIG. 1C and FIG. 1D, the ground pillars 110, the working pillars 112, the through holes TH and the dummy pillars 114 may alternatively have rounded corners. Further, in addition to a rectangle or a square, each of the through holes TH may alternatively have a boundary in a shape of another polygon, a circle or an ellipse.

Figure 2:
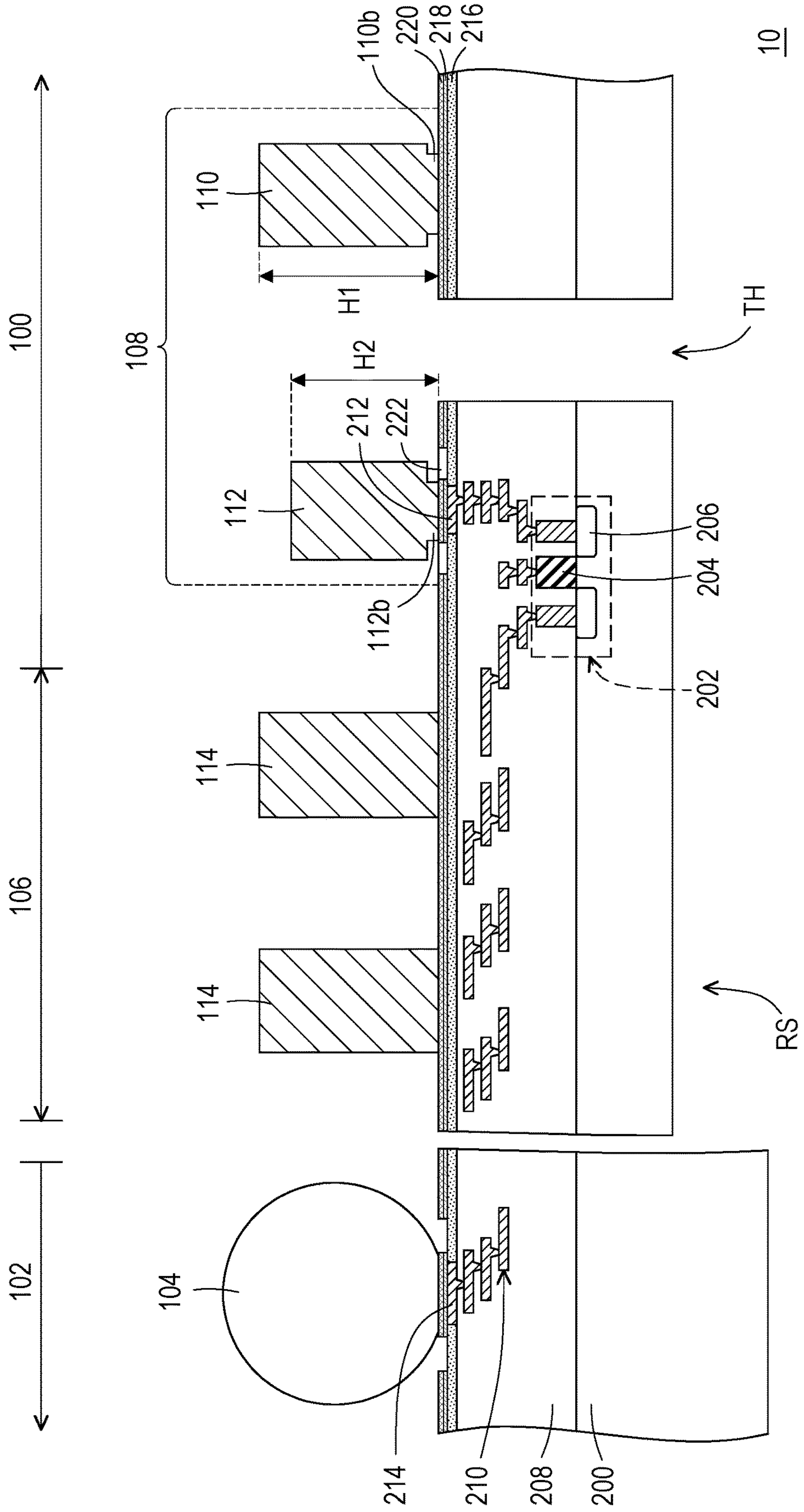
FIG. 2 is a schematic cross-sectional view of the semiconductor chip along, according to some embodiments of the present disclosure.

FIG. 2 is a schematic cross-sectional view of the semiconductor chip 10 along the second direction Y, according to some embodiments of the present disclosure.

Referring to FIG. 2, the semiconductor chip 10 is built on a semiconductor substrate 200. The pillar structures 108, the dummy pillar structures 114 and the electrical connectors 104 are disposed over a front surface of the semiconductor substrate 200, and the through holes TH penetrate through the semiconductor substrate 200. According to some embodiments, a back surface of the semiconductor substrate 200 has a recess RS. The recess RS may span across the dummy region 106 and the device region 100, such that the semiconductor substrate 200 may have a smaller thickness within the dummy region 106 and the device region 100, while having a greater thickness within the peripheral I/O region 102.

Active devices 202 (only a single one is shown) within the device region 100 are formed on the front surface of the semiconductor substrate 200, and are configured to provide working voltages to the working pillars 112 of the pillar structures 108 in the device region 100. As an example, the active devices 202 may be field effect transistors (or simply referred to as transistors), and may respectively include a gate structure 204 formed on the semiconductor substrate 200 and a pair of source/drain structures 206 (one refers to a source terminal and the other refers to a drain terminal) at opposite sides of the gate structure 204. In some embodiments, the active devices 202 are planar-type transistors, and the gate structure 204 in each active device 202 is disposed on a planar portion of the semiconductor substrate 200. Although not shown, in alternative embodiments, the active devices 202 are fin-type transistors, and the gate structure 204 in each active device 202 covers and intersects with a fin structure protruding from the semiconductor substrate 200. Also not shown, in other embodiments, the active devices 202 are gate-all-around (GAA) transistors, and the gate structure 204 in each active device 202 intersects with and wraps around a stack of channel structures (e.g., semiconductor nanosheets) formed on the front surface of the semiconductor substrate 200.

A stack of dielectric layers 208 are globally formed on the front surface of the semiconductor substrate 200, and cover the active devices 202 within the device region 100. In addition, interconnection elements 210 are distributed in the stack of the dielectric layers 208, to connect the active devices 202 to the working pillars 112, and to rout the active devices 202 to the electrical connectors 104 within the peripheral I/O region 102. The interconnection elements 210 may include conductive patterns/lines for providing lateral conduction paths, and include conductive vias/plugs for providing vertical conduction paths. According to some embodiments, the ground pillars 110 of the pillar structures 108 as well as the dummy pillar structures 114 are not electrically connected to the interconnection elements 210 embedded in the stack of the dielectric layers 208.

Top conductive pads 212, 214 are formed on the stack of the dielectric layers 208. The working pillars 112 of the pillar structures 108 stand on the conductive pads 212, and are electrically connected to the interconnection elements 210 and the active devices 202 through the conductive pads 212. On the other hand, the electrical connectors 104 are disposed on the conductive pads 214, and are electrically connected to the interconnection elements 210 and the active devices 202 through the conductive pads 214. Further, the conductive pads 212, 214 may be formed in and laterally surrounded by a passivation layer 216 spanning across the entire front surface of the semiconductor chip 10. The passivation layer 216 is formed of an insulating material. As examples, the insulating material for forming the passivation layer 216 may include silicon nitride, silicon oxide, the like or combinations thereof.

In some embodiments, seed layers 218, 220 are stacked on the passivation layer 216, and span across the entire front surface of the semiconductor chip 10. In these embodiments, the working pillars 112 of the pillar structures 108 are in contact with the conductive pads 212 through the seed layers 218, 220, and the electrical connectors 104 are in contact with the conductive pads 214 through the seed layers 218, 220. On the other hand, the ground pillars 110 of the pillar structures 108 as well as the dummy pillar structures 114 are in contact with the passivation layer 216 through the seed layers 218, 220, and are electrically connected through the seed layers 218, 220, to form a current pathway on the front surface of the semiconductor chip 10. In order to isolate the working pillars 112 and the electrical connectors 104 from such current pathway, portions of the seed layers 218, 220 lying under the working pillars 112 and the electrical connectors 104 are separated from rest portions of the seed layers 218, 220. That is, the working pillars 112 and the electrical connectors 104 are respectively disposed on an island portion of the seed layers 218, 220. According to some embodiments, each island portion of the seed layers 218, 220 on which one of the working pillars 112 stands is separated from surrounding portions of the seed layers 218, 220 by an insulating pattern 222. On the other hand, each island portion of the seed layers 218, 220 on which one of the electrical connectors 104 lays is separated from surrounding portions of the seed layers 218, 220 by a trench. The seed layer 220 is formed over the seed layer 218. Each of the seed layers 218, 220 is formed of a conductive material. As an example, the seed layer 218 is formed of Ti, whereas the seed layer 220 is formed of Au.

According to some embodiments, the working pillar 112 of each pillar structure 108 has a bottom portion **112*b* laterally recessed with respect to rest portion of the working pillar 112. In these embodiments, the bottom portion 112*b* of each working pillar 112 may not cover the underlying insulating pattern 222, while the rest portion of the working pillar 112 may overlap the underlying insulating pattern 222 by a peripheral part. Further, a concave is defined around the bottom portion 112*b* of each working pillar 112. In addition, each working pillar 112 may have a sidewall with a step at an interface between the bottom portion 112*b*** and the overlying portion.

Similarly, in some embodiments, the ground pillar 110 of each pillar structure 108 has a bottom portion **110*b* laterally recessed with respect to rest portion of the ground pillar 110. In these embodiments, a concave is defined around the bottom portion 110*b* of each ground pillar 110. In addition, each ground pillar 110 may have a sidewall with a step at an interface between the bottom portion 110*b* and the overlying portion. On the other hand, the dummy pillar structures 114** may each have a sidewall without a bottom recess/concave.

Moreover, in some embodiments, the ground pillar 110 and the working pillars 112 in each pillar structure 108 may be formed with different heights. In these embodiments, the dummy pillar structures 114 may be as tall as the ground pillars 110. For instance, the ground pillars 110 and the dummy pillar structures 114 may be each formed to a first height H1 greater than a second height H2 of the working pillars 112. As an example, a ratio of the first height H1 over the second height H2 may range from about 1.39 to about 1.69.

As described above, the dummy pillar structures 114 may be susceptible to pattern non-uniformity and/or pattern damages as a result of loading effect, and thus are designed to have increased contact area with an underlying supporting structure. A manufacturing process for forming the semiconductor chip 10 will be described, and one of the issues of the dummy pillar structures 114 will be discussed.

Figure 3:
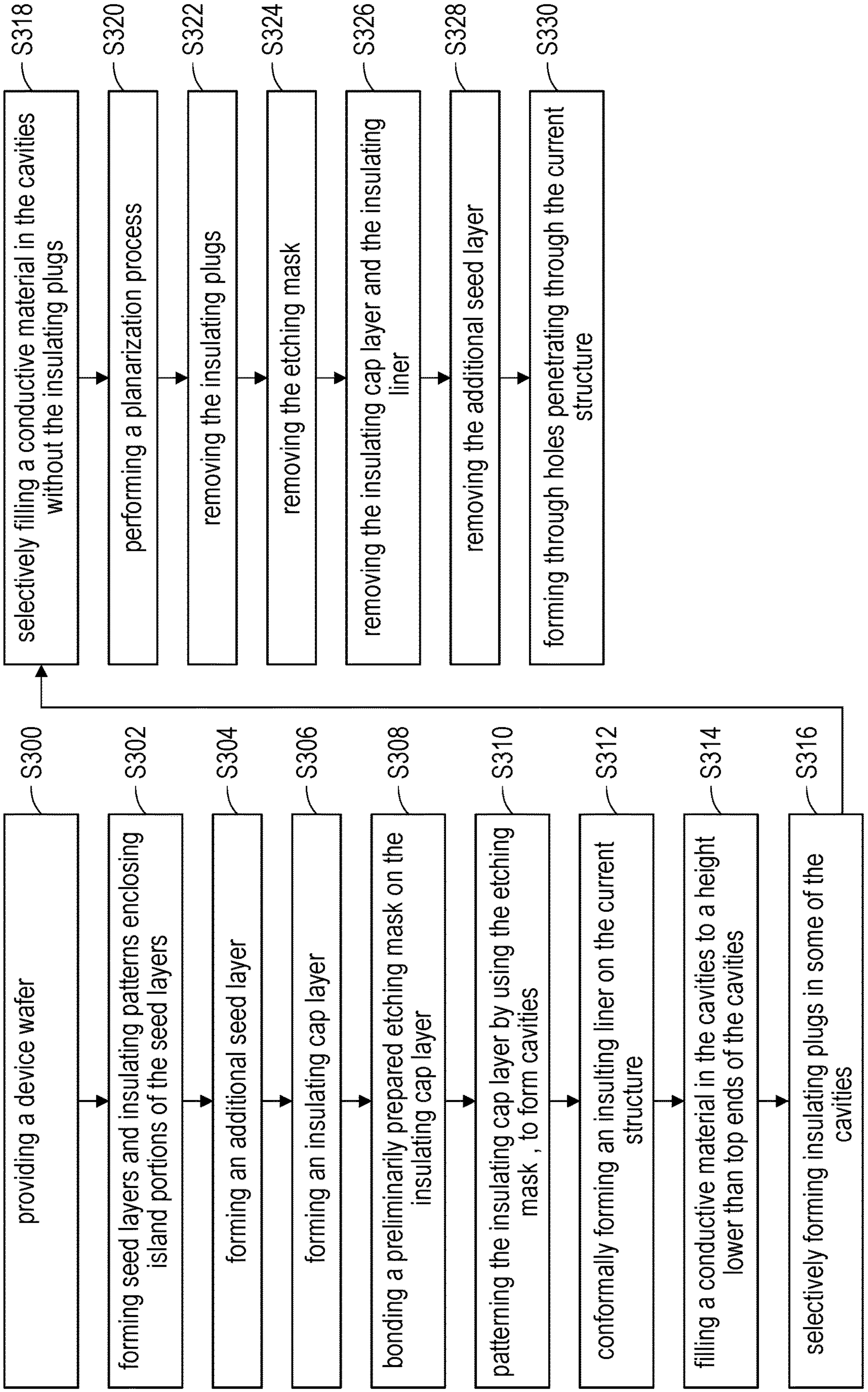
FIG. 3 is a flow diagram illustrating a process for forming the semiconductor chip, according to some embodiments of the present disclosure.
Figure 4A:
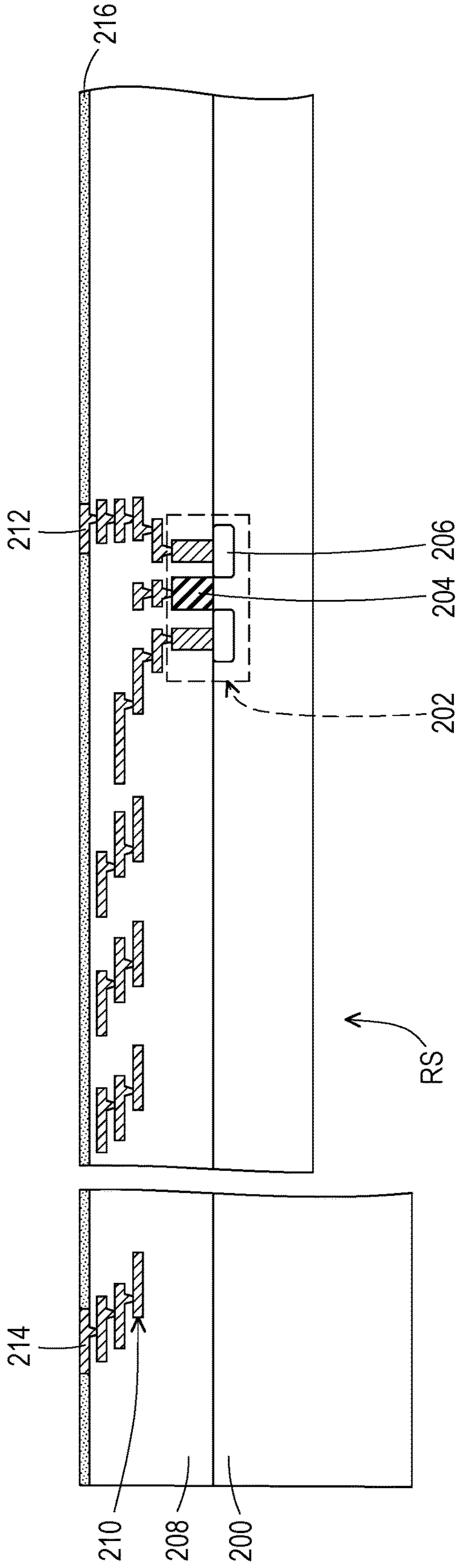
FIG. 4A through FIG. 4P are schematic cross-sectional views illustrating intermediate structures at various stages during the process shown in FIG. 3.

FIG. 3 is a flow diagram illustrating a process for forming the semiconductor chip 10, according to some embodiments of the present disclosure. FIG. 4A through FIG. 4P are schematic cross-sectional views illustrating intermediate structures at various stages during the process shown in FIG. 3.

Referring to FIG. 3 and FIG. 4A, at a step S300, providing a device wafer including the semiconductor substrate 200; the active devices 202 on a front surface of the semiconductor substrate 200; the stack of the dielectric layers 208 and the interconnection elements 210 covering the active devices 202; and the conductive pads 212, 214 as well as the passivation layer 216 lying on the stack of the dielectric layers 208. Further, in some embodiments, the semiconductor substrate 200 may also have the recess RS at back side.

Figure 4B:
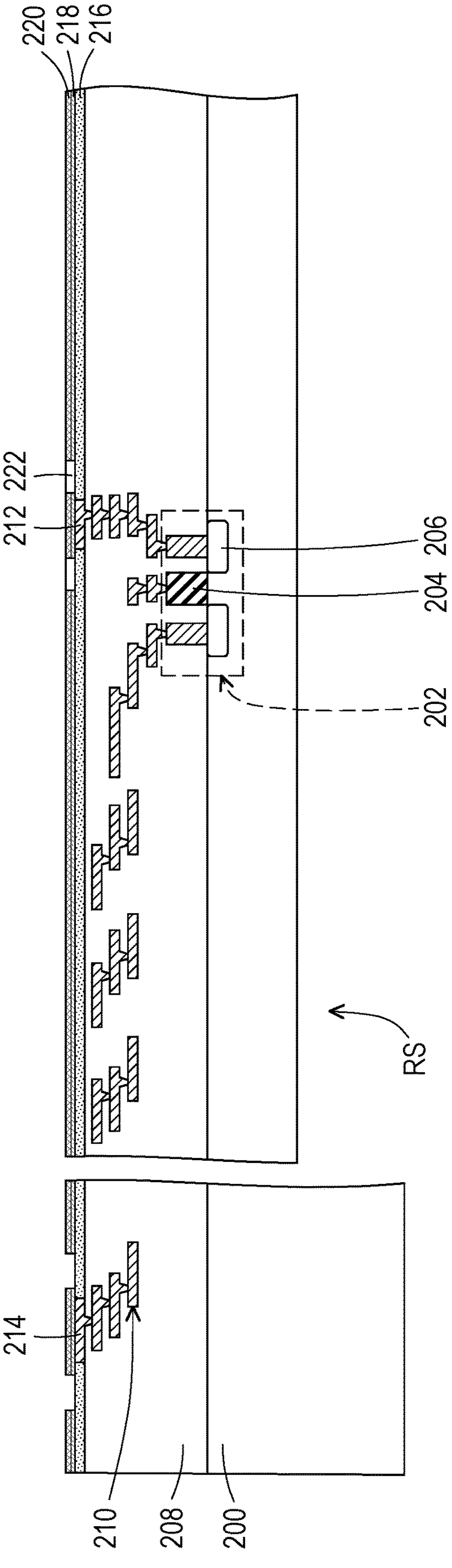

Referring to FIG. 3 and FIG. 4B, at a step S302, the seed layers 218, 220 as well as the insulating patterns 222 (only a single one is shown) are formed on the passivation layer 216 and the conductive pads 212, 214. In some embodiments a method for forming the seed layers 218, 220 includes forming two blanket conductive layers on the passivation layer 216 and the conductive pads 212, 214, and patterning the blanket conductive layers to form the seed layers 218, 220 with the island portions to be placed with the working pillars 112 and the electrical connectors 104. As the seed layers 218, 220 are formed, the insulating patterns 222 are provided to laterally enclose the island portions of the seed layers 218, 220 to be placed with the working pillars 112.

Figure 4C:
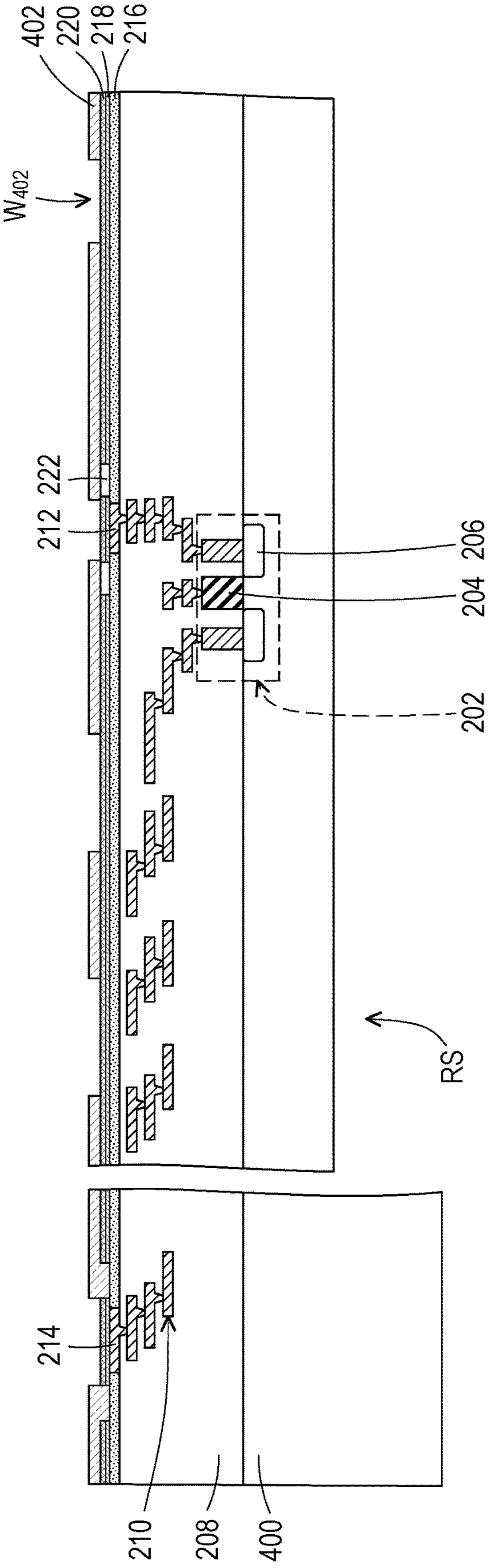

Referring to FIG. 2 and FIG. 4C, at a step S304, an additional seed layer 402 is formed on the seed layers 218, 220. The seed layer 402 has openings $W_{402}$ for accommodating the ground pillars 110, the working pillars 112 and the dummy pillar structures 114, and may fill out the trenches enclosing the island portions of the seed layers 218, 220 to be placed with the electrical connectors 104. The seed layer 402 is formed of a conductive material. In the example where the seed layer 218 is formed of Ti and the seed layer 220 is formed of Au, the seed layer 402 may be formed of Ti as well. According to some embodiments, a method for forming the seed layer 402 includes forming a blanket conductive layer, and then patterning the blanket conductive layer to form the seed layer 402.

Figure 4D:
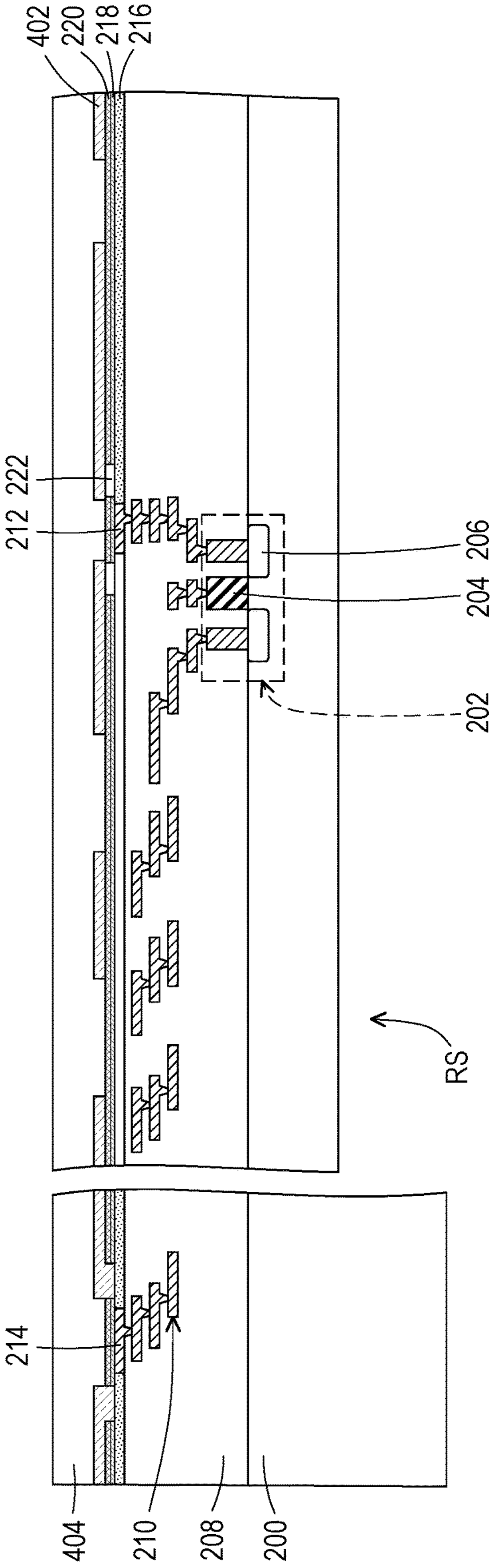

Referring to FIG. 3 and FIG. 4D, at a step S306, an insulating cap layer 404 is formed on the current structure. The insulating cap layer 404 may cover the entire structure as shown in FIG. 4C, such that the insulating cap layer 404 may completely cover the seed layer 402, and fill out the openings $W_{402}$ of the seed layer 402.

Figure 4E:
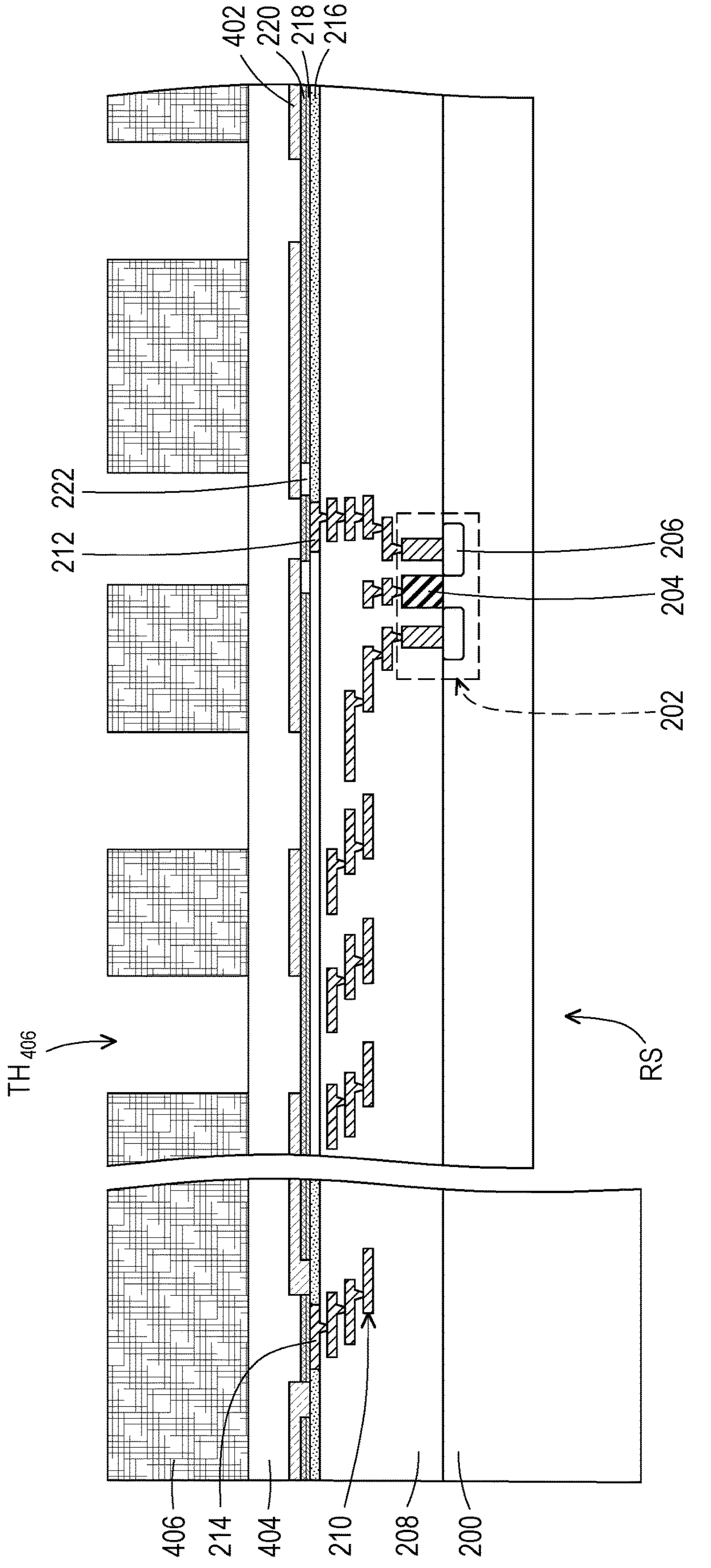

Referring to FIG. 3 and FIG. 4E, at a step S308, a preliminarily prepared etching mask 406 is bonded onto the insulating cap layer 404. The etching mask 406 is positioned such that through holes $TH_{406}$ of the etching mask 406 overlap the openings of the seed layer 402 for accommodating the ground pillars 110, the working pillars 112 and the dummy pillar structures 114. According to some embodiments, the through holes TH 406 overlapping the openings $W_{402}$ of the seed layer 402 (as shown in FIG. 4C) for accommodating the working pillars 112 are slightly larger in width than these openings $W_{402}$. On the other hand, the through holes $TH_{406}$ overlapping the openings $W_{402}$ of the seed layer 402 for accommodating the ground pillars 110 and the dummy pillar structures 114 are substantially identical in width with these openings $W_{402}$.

Figure 4F:
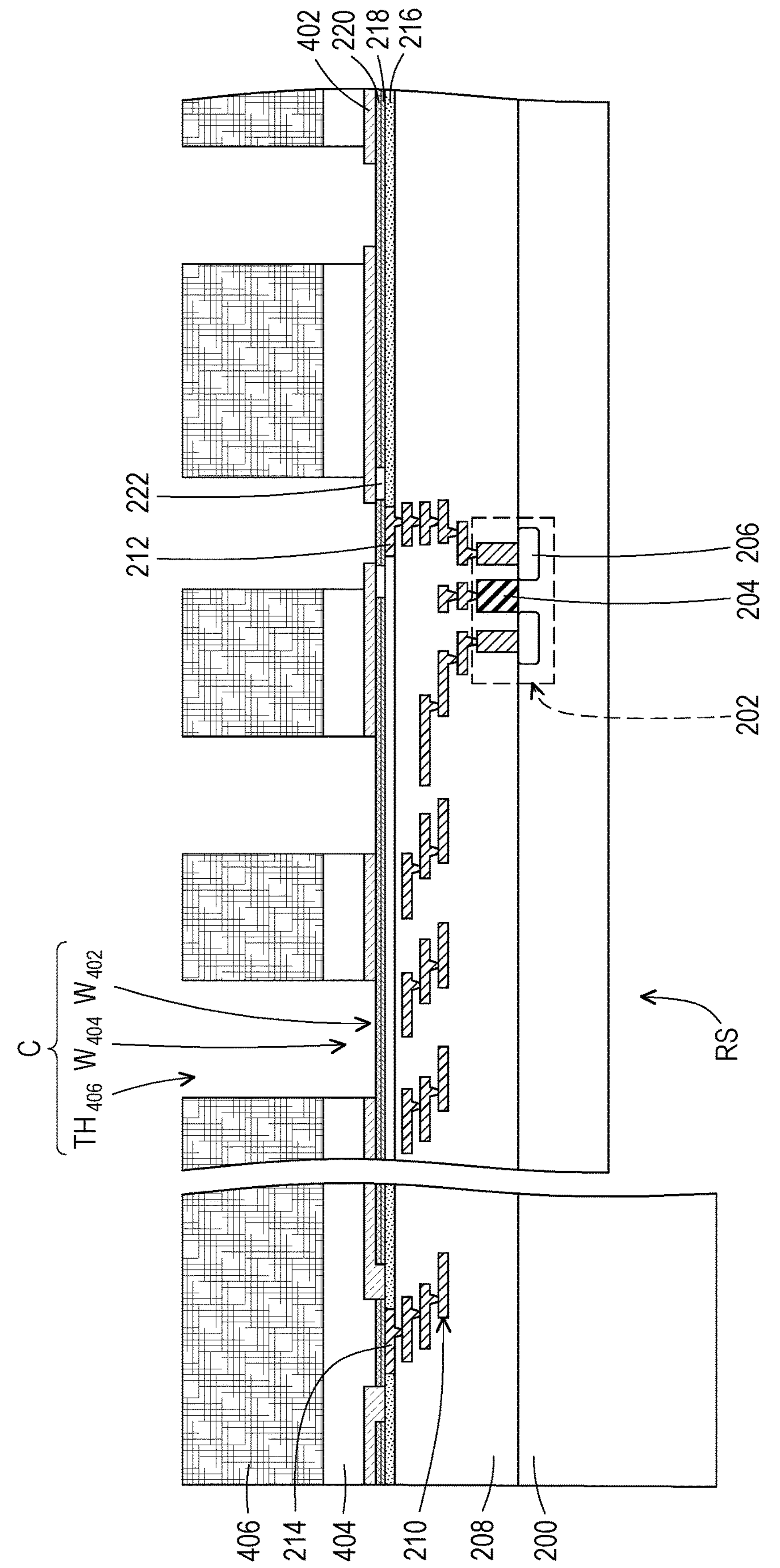

Referring to FIG. 3 and FIG. 4F, at a step S310, the insulating cap layer 404 is patterned by using the etching mask 406. A method for patterning the insulating cap layer 404 includes performing an etching process. Portions of the insulating cap layer 404 overlapped with the through holes $TH_{406}$ of the etching mask 406 are removed, whereas other portions of the insulating cap layer 404 shielded by the etching mask 406 remain. As a result, the insulating cap layer 404 is patterned to have openings $W_{404}$. The openings $W_{404}$ are communicated with the through holes $TH_{406}$ of the etching mask 406 and the openings $W_{402}$ of the seed layer 402, to form cavities C for accommodating the ground pillars 110, the working pillars 112 and the dummy pillar structures 114.

In each of the cavities for accommodating the working pillars 112, the through hole $TH_{406}$ and the opening $W_{404}$ may be larger in size as compared to the opening of the seed layer 402, thus the seed layer 402 may laterally protrude into each of these cavities. As a result, these cavities may each have a bottom necking portion, and the working pillars 112 to be formed in these cavities may have the corresponding bottom necking portions. Further, the protruding portions of the seed layer 402 may cover the insulating patterns 222. That is, the insulating patterns 222 may be overlapped with these cavities for accommodating the working pillars 112, but are covered by the protruding portions of the seed layer 402.

Similarly, in each of the cavities for accommodating the ground pillars 110, the through hole $TH_{406}$ and the opening $W_{404}$ may be larger in size as compared to the opening of the seed layer 402, thus the seed layer 402 may laterally protrude into each of these cavities as well. As a result, these cavities may each have a bottom necking portion, and the ground pillars 110 to be formed in these cavities may have the corresponding bottom necking portions.

On the other hand, in each of the cavities for accommodating the dummy pillar structures 114, the through hole $TH_{406}$ of the etching mask 406 and the opening $W_{404}$ of the insulating cap layer 404 may be substantially identical in size with the opening of the seed layer 402. Therefore, these cavities may not have bottom necking portions, and so as the dummy pillar structures 114 to be formed in these cavities.

Figure 4G:
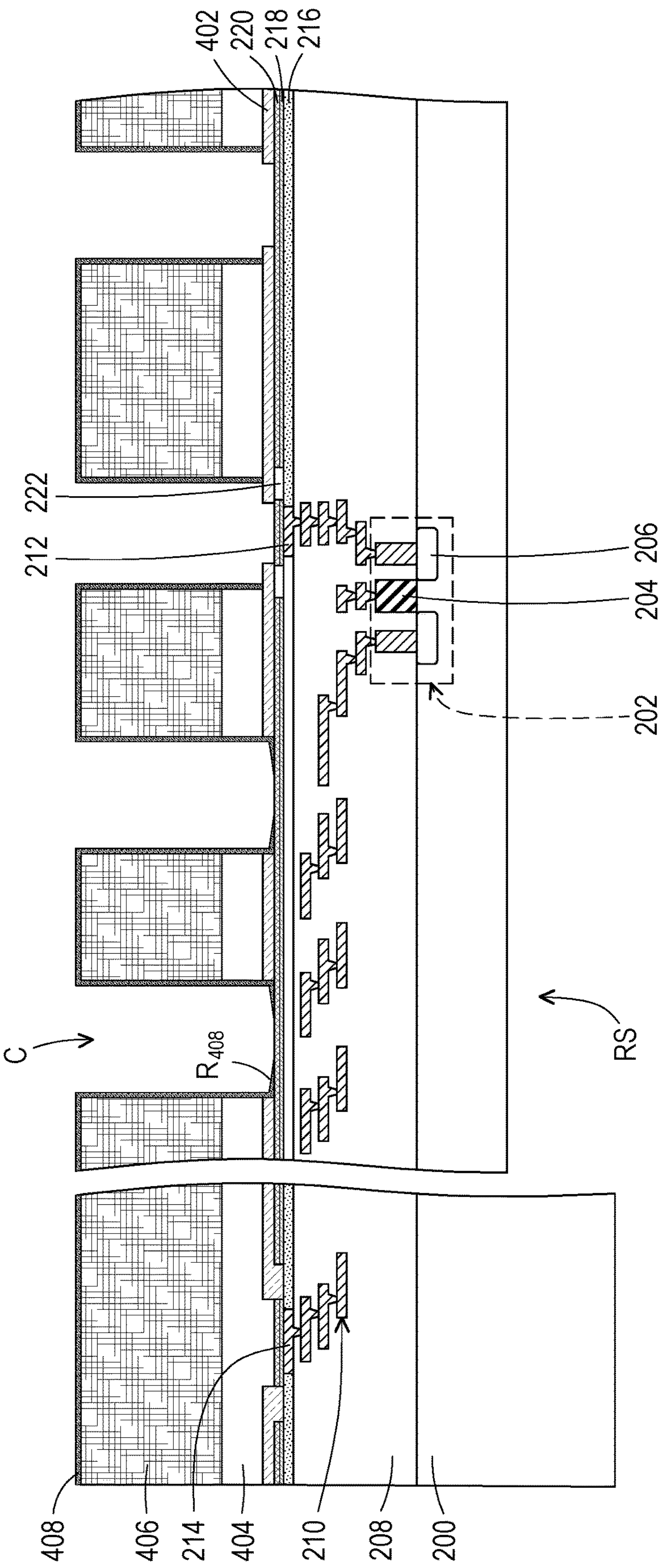

Referring to FIG. 3 and FIG. 4G, at a step S312, an insulating liner 408 is conformally formed on the current structure. A top surface of the etching mask 406 and sidewalls of the cavities C are covered by the insulating liner 408. On the other hand, bottom surfaces of the cavities C are remained exposed. The bottom surfaces of the cavities C for accommodating the working pillars 112 and the ground pillars 110 are defined by surfaces of the seed layer 220 and the lateral protruding portions of the seed layer 402, while the bottom surfaces of the cavities C for accommodating the dummy pillar structures 114 may be defined by surfaces of the seed layer 220 alone. According to some embodiments, a method for forming the insulating liner 408 includes forming a blanket liner globally covering the structure as shown in FIG. 4F, and removing portions of the blanket liner covering the bottom surfaces of the cavities C by an etching process. The insulating liner 408 is obtained as remained portions of the blanket liner. Since the cavities C for accommodating the dummy pillar structures 114 are located within the dummy region 106 defined between a high pattern density region (i.e., the device region 100) and a low pattern density region (i.e., the open area between the device region 100 and the peripheral I/O region 102), the etching process may not be perfectly performed for completely removing portions of the blanket liner covering the bottom surfaces of the cavities C for accommodating the dummy pillar structures 114, as a result of loading effect. Consequently, etching residues $R_{408}$ of the blanket liner may remain as portions of the insulating liner 408. In a subsequent step for removing the insulating liner 408 after formation of the dummy pillar structures 114, ground support of the dummy pillar structures 114 may be damaged. Nevertheless, since the dummy pillar structures 114 are designed with enlarged contact area with the ground support, collapse of the dummy pillar structures 114 can be effectively avoided.

Figure 4H:
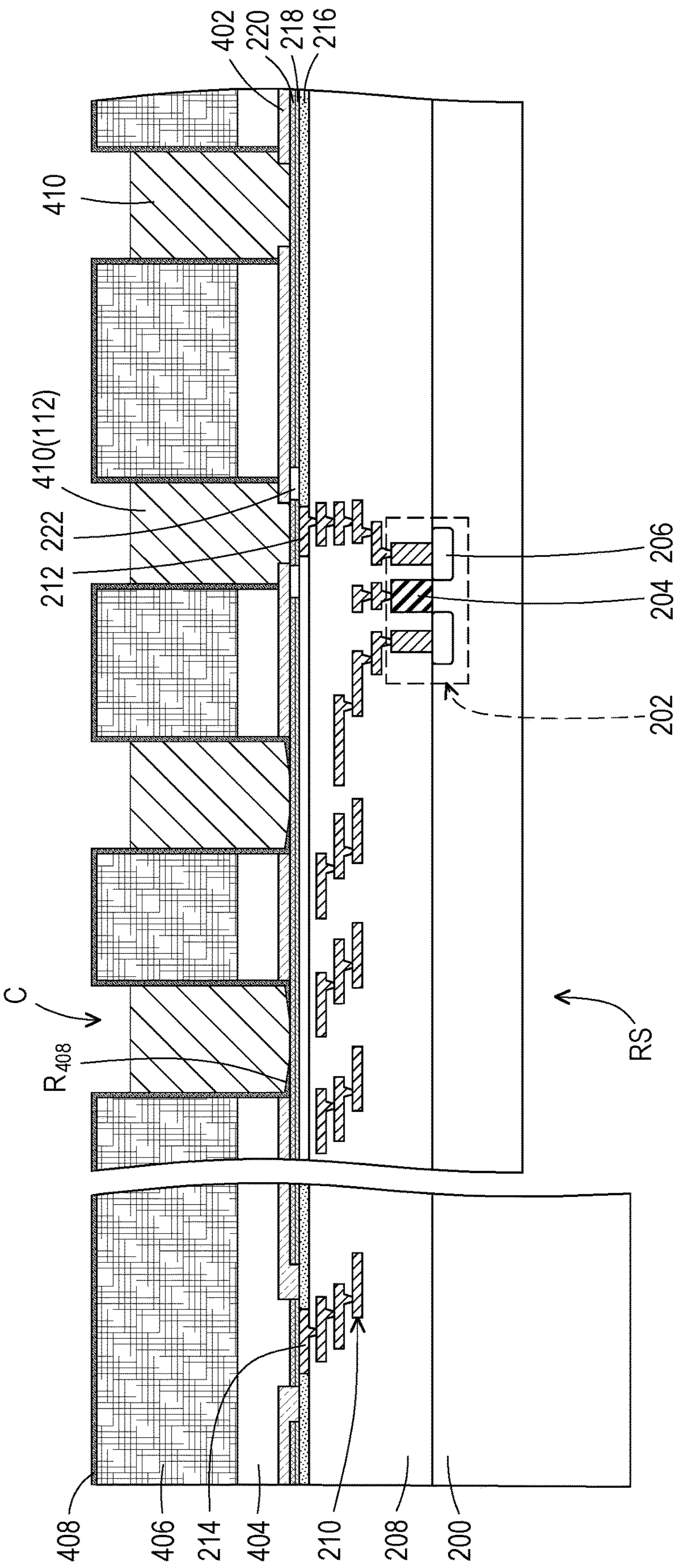

Referring to FIG. 3 and FIG. 4H, at a step S314, a conductive material 410 is filled in the cavities C to a height of the working pillars 112. Portions of the conductive material 410 filled in the cavities C overlapping the conductive pads 212 form the working pillars 112, and portions of the conductive material 410 filled in others of the cavities C form lower portions of the ground pillars 110 and the dummy pillar structures 114. According to some embodiments, a plating process is used for forming the conductive material 410.

Figure 4I:
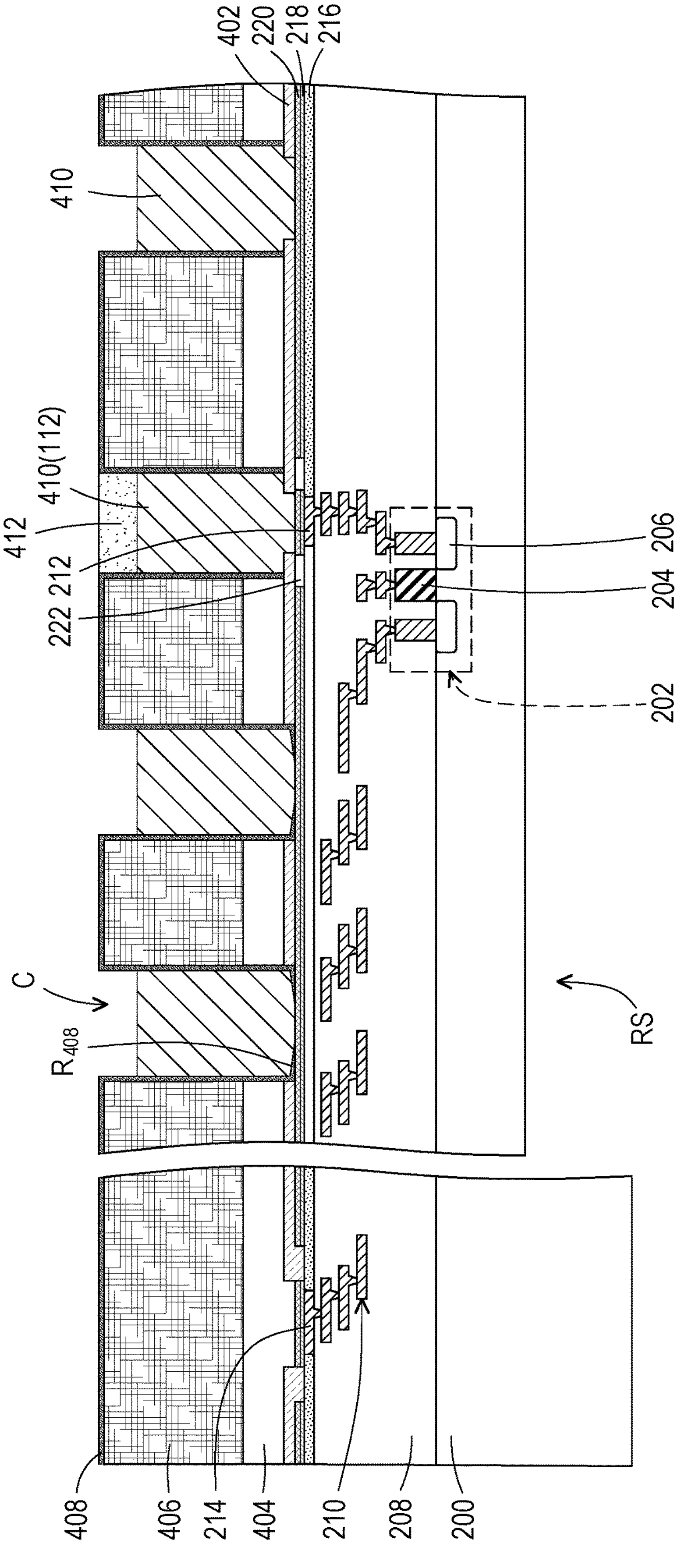

Referring to FIG. 3 and FIG. 4I, at a step S316, insulating plugs 412 (only a single one is shown) are selectively formed on the working pillars 112. As a result, the cavities C accommodating the working pillars 112 may be filled up by the insulating plugs 412. By forming the insulating plugs 412 on the working pillars 112, the working pillar 112 can be prevented from further growth in a subsequent plating process. In some embodiments, the insulating plugs 412 are formed of a photoresist material, and a coating process and a lithography process may be performed for forming the insulating plugs 412.

Figure 4J:
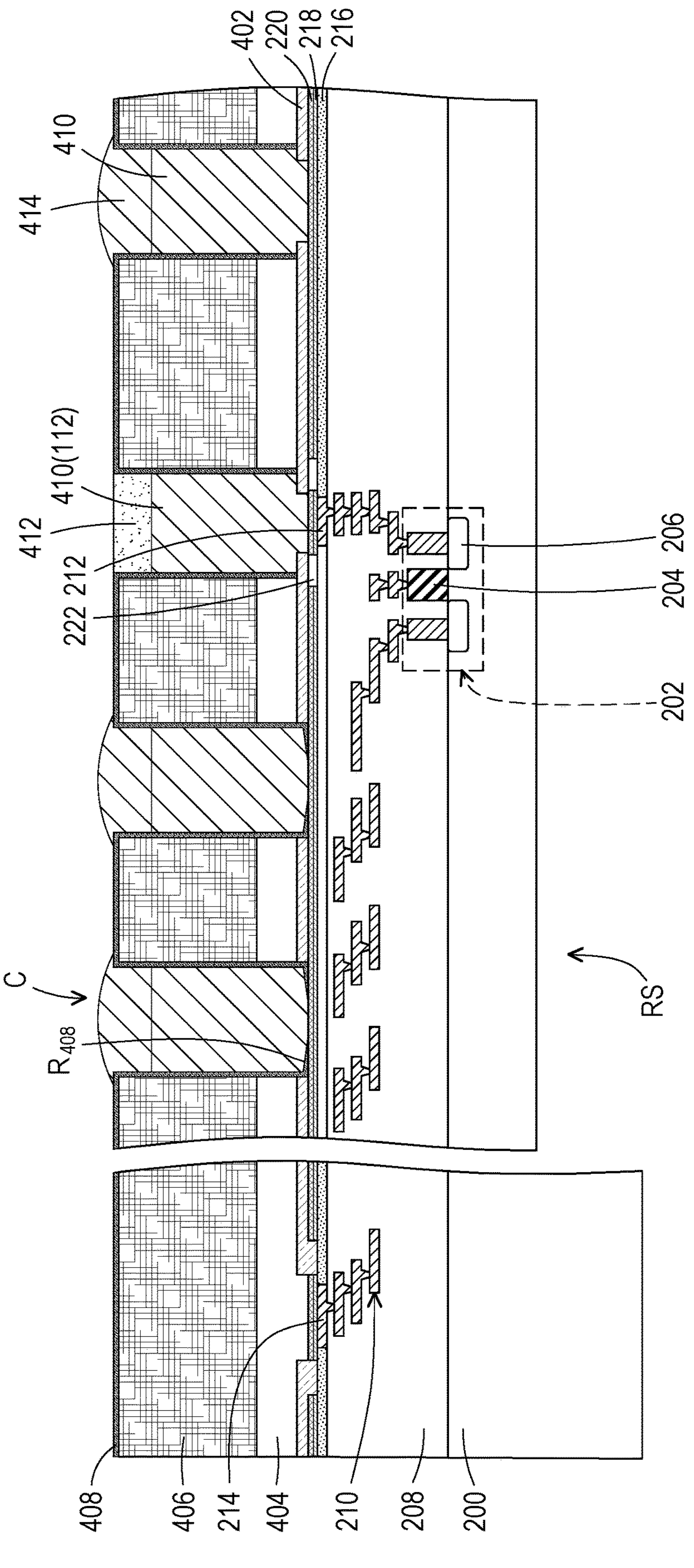

Referring to FIG. 3 and FIG. 4J, at a step S318, a conductive material 414 is selectively formed on portions of the conductive material 410 not shielded by the insulating plugs 412. In other words, the conductive material 414 is formed in the cavities C for accommodating the ground pillars 110 and the dummy pillar structures 114. The conductive material 414 may fill up these cavities C, and may further protrude from top corners of these cavities C. A plating process may be used for forming the conductive material 414. Since the working pillars 112 are shield by the insulating plugs 412, the working pillars 112 can be prevented from further growth during the plating process.

Figure 4K:
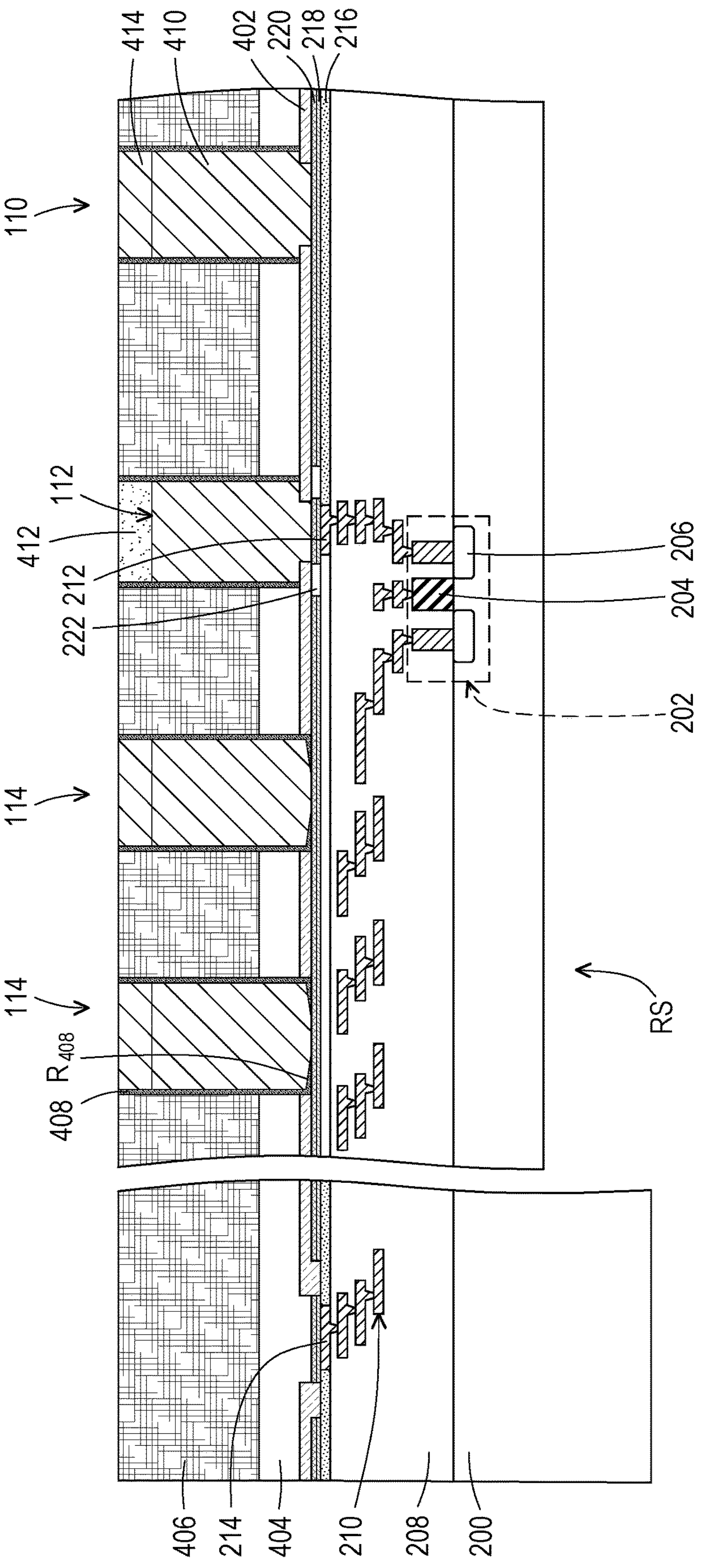

Referring to FIG. 3 and FIG. 4K, at a step S320, a planarization process may be performed. As a result of the planarization process, portions of the conductive material 414 and the insulating liner 408 above the etching mask 406 may be removed. Remained portions of the conductive material 414 and the underlying portions of the conductive material 410 form the ground pillars 110 and the dummy pillar structures 114. In some embodiments, the planarization process may include a polishing process, an etching process or a combination thereof.

Figure 4L:
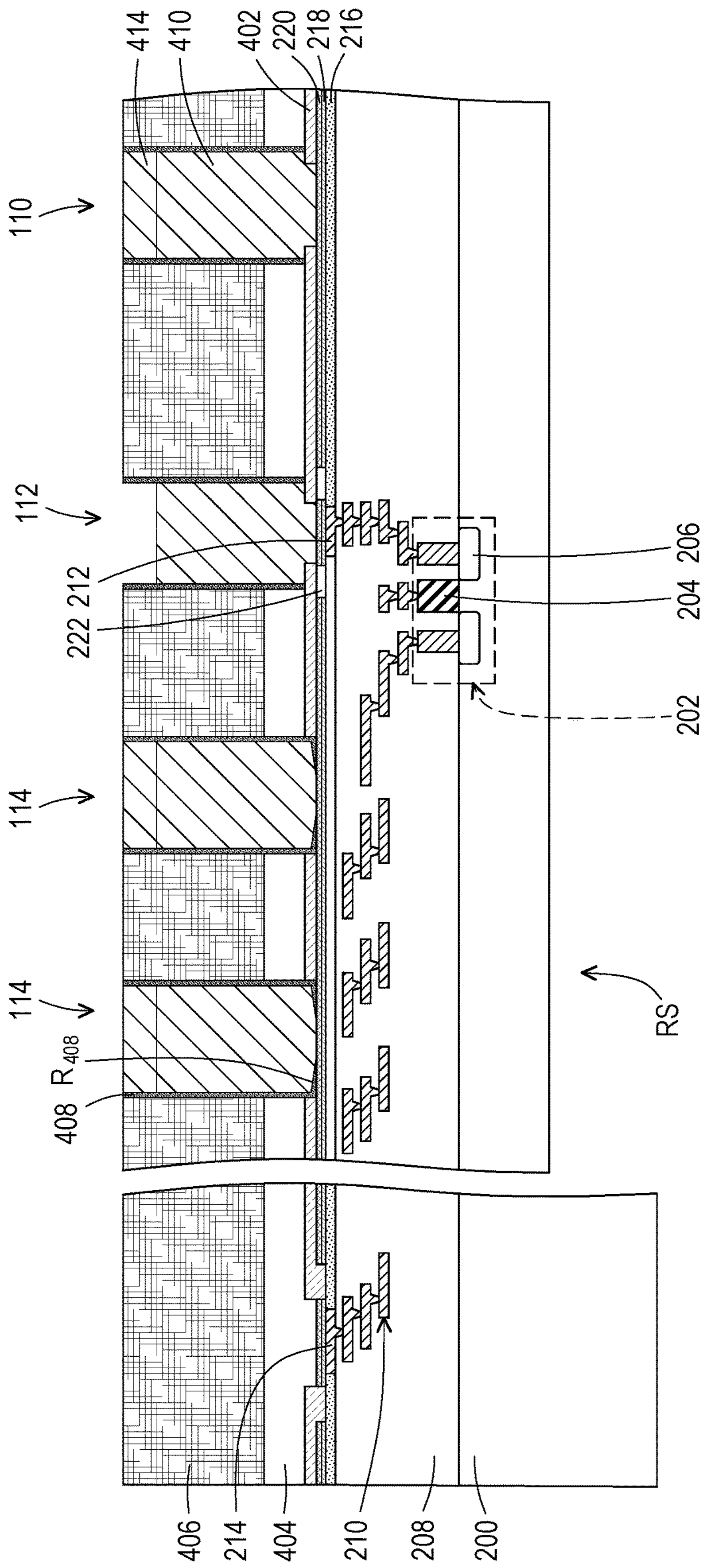

Referring to FIG. 3 and FIG. 4L, at a step S322, the insulating plugs 412 are removed. As a result, the underlying working pillars 112 may be currently exposed. In those embodiments where the insulating plugs 412 are formed of a photoresist material, a stripping process or an ashing process may be used for removing the insulating plugs 412.

Figure 4M:
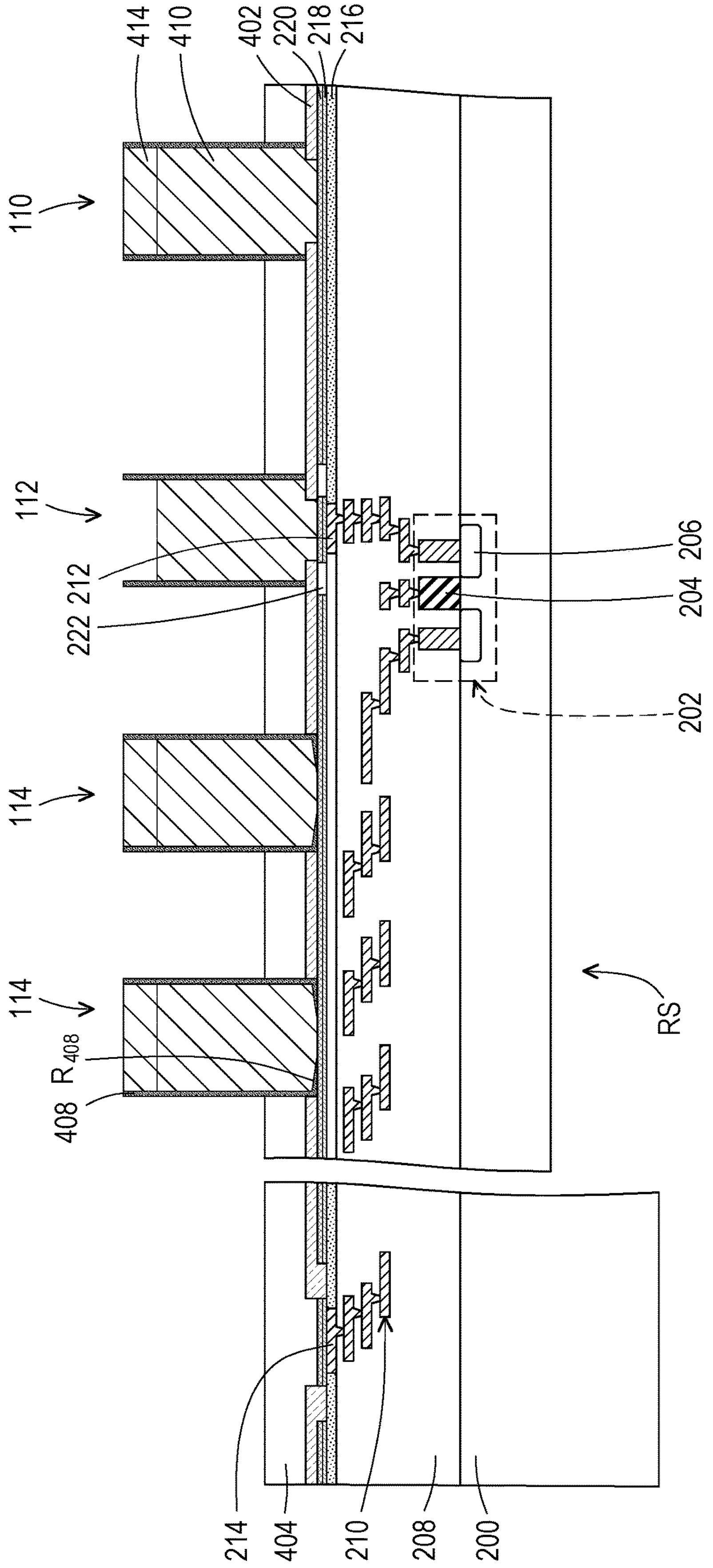

Referring to FIG. 3 and FIG. 4M, at a step S324, the etching mask 406 is removed. According to some embodiments, an etching process is used for removing the etching mask 406. Portions of the insulating liner 408 laterally surrounded by the etching mask 406 may not subject to the etching process, and are remained on surfaces of the ground pillars 110, the working pillars 112 and the dummy pillar structures 114 after the etching process. Alternatively, these portions of the insulating liner 406 may be removed along with the etching mask 406, and upper portions of the sidewalls of the ground pillars 110, the working pillars 112 and the dummy pillar structures 114 may be exposed.

Figure 4N:
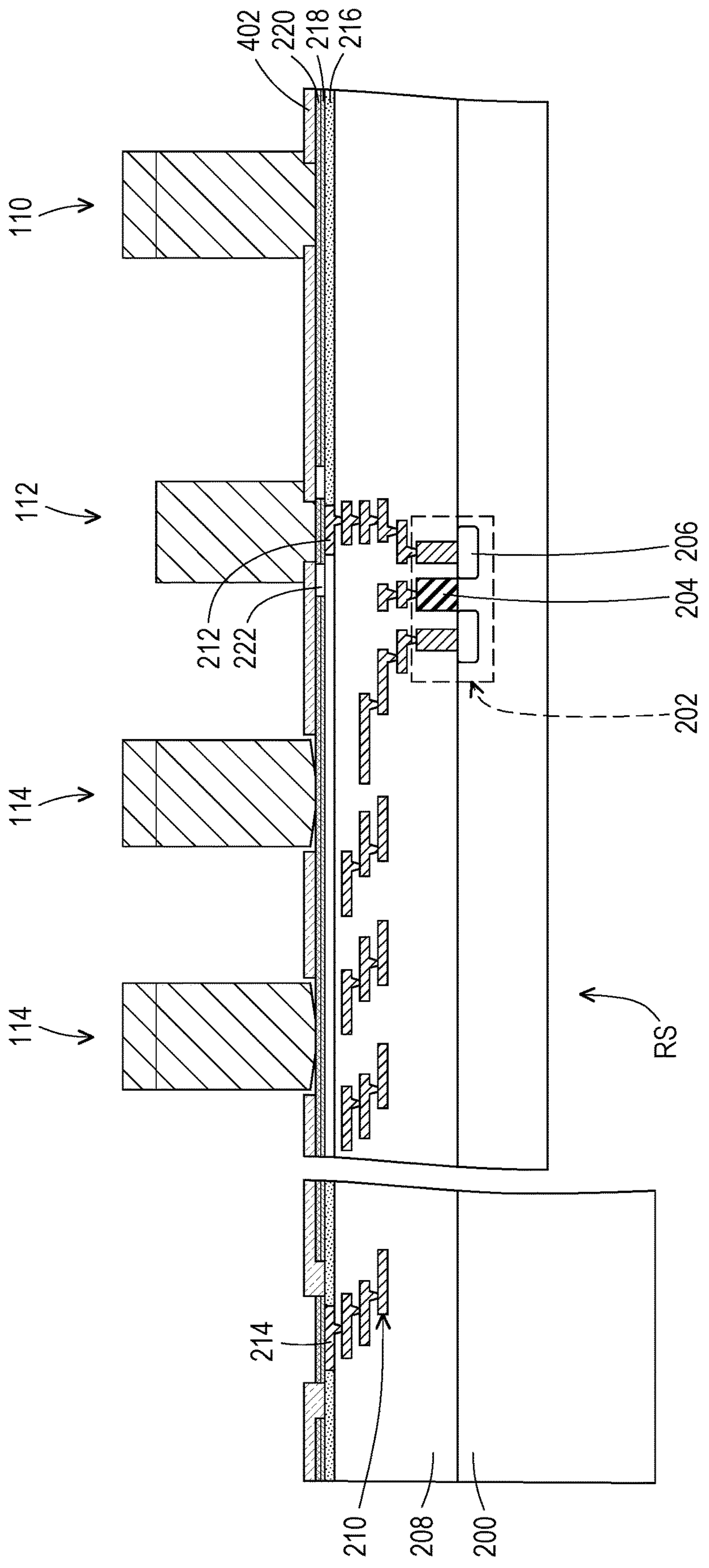

Referring to FIG. 3 and FIG. 4N, at a step S326, the insulating cap layer 404 and the insulating liner 408 are removed. As a result, the seed layer 402 may be currently exposed. According to some embodiments, an isotropic etching process is used for removing the insulating cap layer 404 and the insulating liner 408. Since the etching residues $R_{408}$ of the insulating liner 408 may be left under the dummy pillar structures 114 due to loading effect, support of the dummy pillar structures 114 may be impaired when the insulating liner 408 (including the etching residues $R_{408}$ as portions of the insulating liner 408) is removed. Nevertheless, since the dummy pillar structures 114 are designed with increased contact area with the underlying supporting structure (e.g., the seed layer 220), the dummy pillar structures 114 may be prevented from collapse, even when the support for the dummy pillar structures 114 is impaired.

Figure 4O:
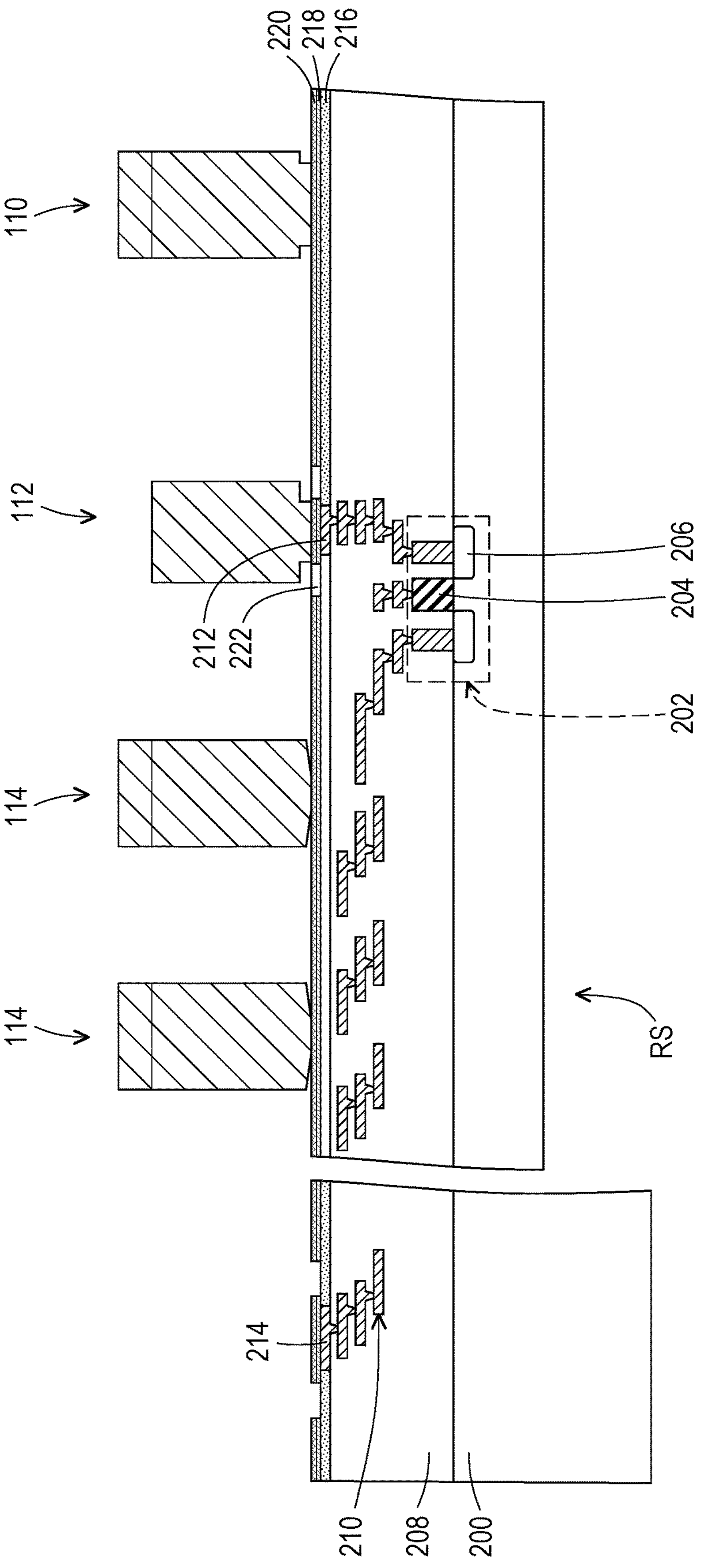
Figure 4P:
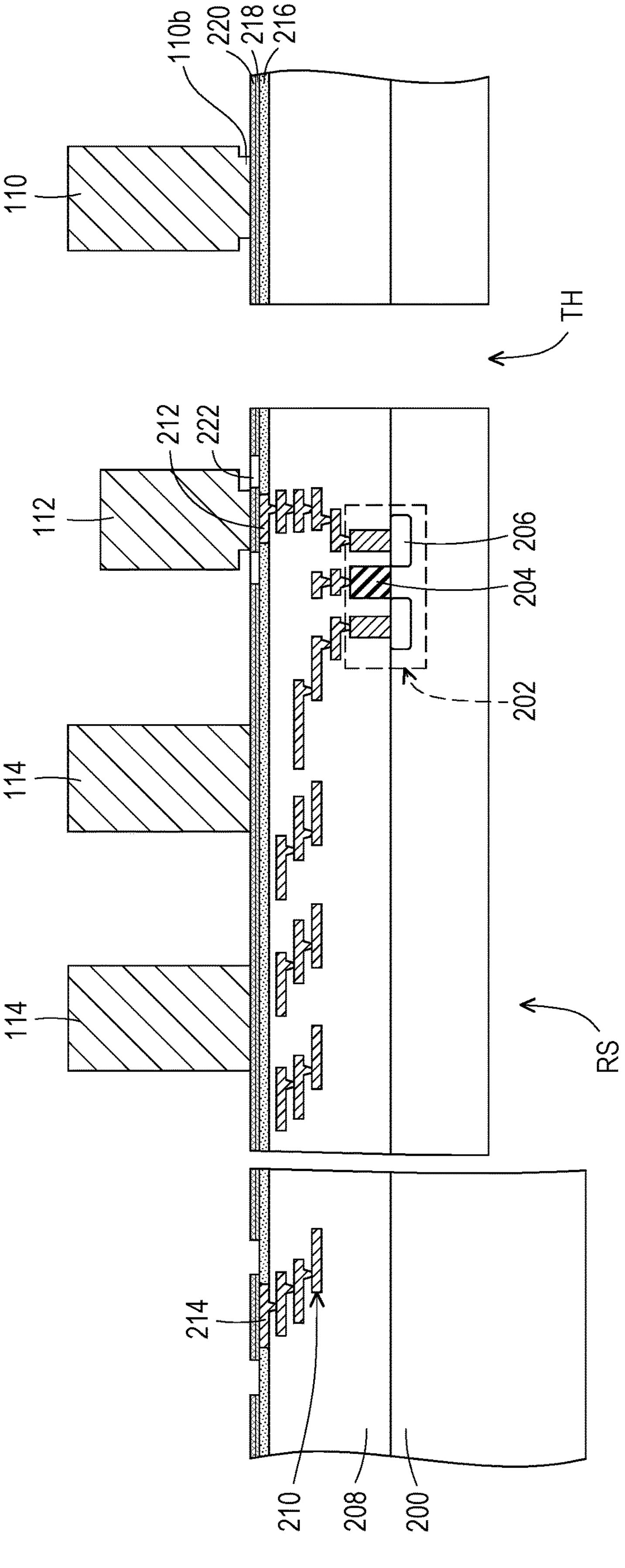

Referring to FIG. 3 and FIG. 4O, at a step S328, the seed layer 402 is removed. Accordingly, the seed layer 220 and the insulating pattern 222 enclosing the island portions of the seed layer 220 may be exposed, and the bottom necking features of the ground pillars 110 and the working pillars 112 may be manifested.

Referring to FIG. 3 and FIG. 4P, at a step S330, the through holes TH are formed through the semiconductor substrate 200 as well as the overlying dielectric layers 208, passivation layer 216 and seed layers 218, 220. According to some embodiments, a Bosch process including alternating deposition processes and etching processes is used for forming the through holes TH.

Afterwards, the current structure may be singulated. One of the singulated structures further placed with the electrical connectors 104 may form the semiconductor chip 10 as described with reference to FIG. 1A through FIG. 1D and FIG. 2. Although not shown, the semiconductor chip 10 may be further subjected to a packaging process, to form a semiconductor package.

As will be further described, variations may be applied to the pillar structures 108 and the dummy pillar structures 114.

Figure 5:
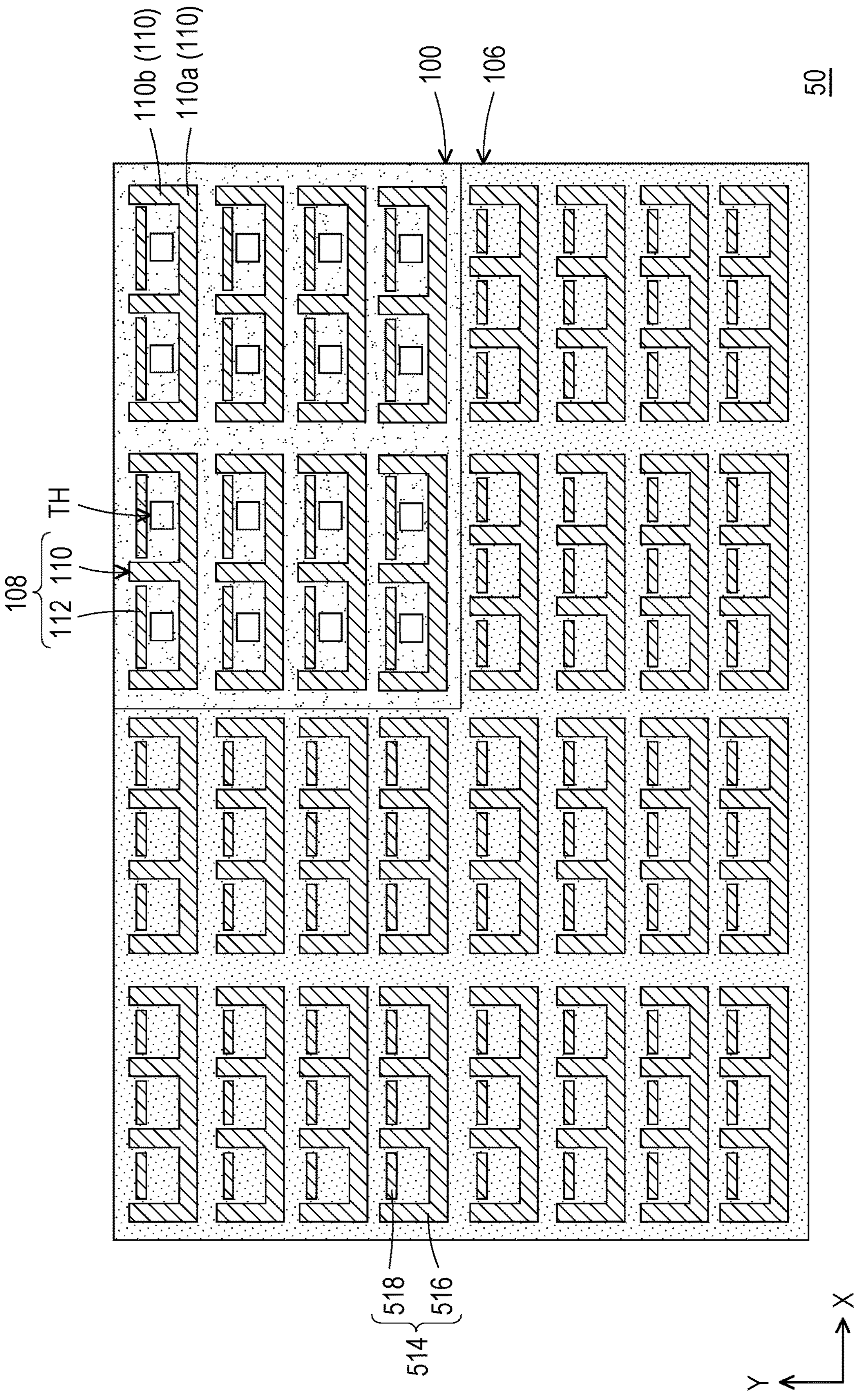
FIG. 5 is a schematic plan view illustrating a portion of a semiconductor chip, according to some embodiments of the present disclosure.

FIG. 5 is a schematic plan view illustrating a portion of a semiconductor chip 50, according to some embodiments of the present disclosure.

As similar to the semiconductor chip 10 described with reference to FIG. 1A through FIG. 1D and FIG. 2, the semiconductor chip 50 has the device region 100, the dummy region 106 laterally enclosing the device region 100 and the peripheral I/O region 102 (not shown) laterally surrounding the dummy region 106 and the device region 100. A corner of the device region 100 and the adjacent portion of the dummy region 106 of the semiconductor chip 50 are shown in FIG. 5. As shown in FIG. 5, an array of the pillar structures 108 are deployed on a front surface of the semiconductor chip 50 within the device region 100, and the through holes TH are arranged between the working pillars 112 and the ground pillars 110 of the pillar structures 108. As a difference from the semiconductor chip 10, the semiconductor chip 50 includes dummy pillar structures 514 arranged on the front surface of the semiconductor chip 50 within the dummy region 106, rather than the dummy pillar structures 114.

In some embodiments, each of the dummy pillar structures 514 includes a first pillar 516 and multiple second pillars 518. The first pillar 516 is identical with each of the dummy pillar structures 114 as described with reference to FIG. 1B, FIG. 1D and FIG. 2, and has a line portion and multiple laterally protruding portions separately protrude from a single side of the line portion. On the other hand, the second pillars 518 are similar to the working pillars 112 of the pillar structures 108. That is, the second pillars 518 may be substantially parallel to the line portions of the first pillars 516, and respectively extend between and spaced apart from two laterally protruding portions of one of the first pillar 516.

Although not shown, the first pillars 516 and the second pillars 518 may stand on the seed layers 218, 220 (as shown in FIG. 2), and are electrically connected to the ground pillars 110 of the pillar structures 108 through the seed layers 218, 220, to form a current pathway on the front surface of the semiconductor chip 50. Further, in some embodiments, the second pillars 518 may be formed to a height lower than a height of the first pillars 516. For instance, the second pillars 518 may be as tall as the working pillars 112 of the pillar structures 108, whereas the first pillars 516 may be as tall as the ground pillars 110 of the pillar structures 108. In alternative embodiments, the second pillars 518 may be as tall as the first pillars 516. For instance, the first and second pillars 516, 518 may be as tall as the ground pillars 110 of the pillar structures 108.

Figure 6:
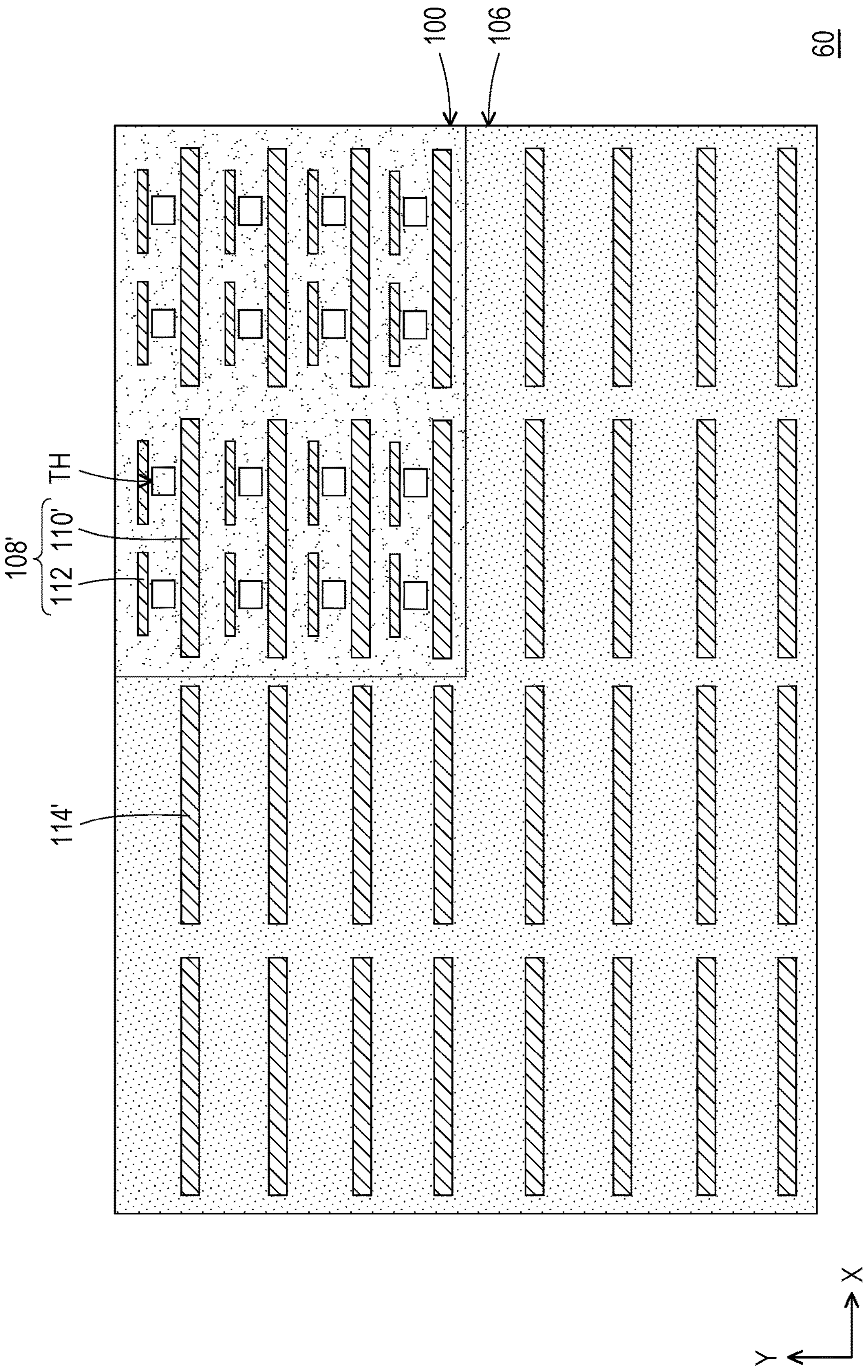
FIG. 6 is a schematic plan view illustrating a portion of a semiconductor chip, according to some embodiments of the present disclosure.

FIG. 6 is a schematic plan view illustrating a portion of a semiconductor chip 60, according to some embodiments of the present disclosure.

The semiconductor chip 60 is similar to the semiconductor chip 10 as described with reference to FIG. 1A through FIG. 1D and FIG. 2, except for pattern design of ground pillars and dummy pillar structures. As shown in FIG. 6, pillar structures 108' within the device region 100 of the semiconductor chip 60 are similar with the pillar structures 108 described with reference to FIG. 1B, FIG. 1C and FIG. 2, except that ground pillars 110' of the pillar structures 108' are free of laterally protruding portions. That is, the ground pillars 110' may only include line portions. The working pillars 112 are substantially parallel with the ground pillar 110', and the through holes TH are arranged between the working pillars 112 and the ground pillars 110'. Similarly, dummy pillar structures 114' within the dummy region 106 are free of laterally protruding portions, and only include line portions.

Since the semiconductor chips 10, 50, 60 are only different in pattern design of the dummy pillar structures and the pillar structures, a process described with reference to FIG. 3 and FIG. 4A through FIG. 4P may be used for forming each of the semiconductor chips 50, 60.

As above, a semiconductor chip and a manufacturing method of the semiconductor chip are provided. An array of pillar structures are disposed on a front surface of a central region of the semiconductor chip. Further, the pillar structures are laterally surrounded by dummy pillar structures. Instead of peripheral ones of the pillar structures, the dummy pillar structures are located at an interface between a high pattern density region (i.e., the central region) and a low pattern density region (an open region around the dummy pillar structures). Therefore, by disposing the dummy pillar structures sacrificial to impact of loading effect, the pillar structures laterally surrounded by the dummy pillar structures can be formed with significantly improved uniformity. In some embodiments, the dummy pillar structures are designed with increased contact area with the underlying supporting structure. In these embodiments, even being sacrificial to impact of loading effect, the dummy pillar structures are less susceptible to pillar collapse, thus yield for manufacturing the semiconductor chip can be effectively improved.

In an aspect of the present disclosure, a semiconductor chip is provided. The semiconductor chip comprises: an array of pillar structures, disposed on a front surface of the semiconductor chip, and respectively comprising a ground pillar and multiple working pillars laterally spaced apart from and substantially parallel with a line portion of the ground pillar, wherein active devices formed inside the semiconductor chip are electrically connected to the working pillars; and dummy pillar structures, disposed on the front surface of the semiconductor chip and laterally surrounding the pillar structures, wherein the ground pillars of the pillar structures and the dummy pillar structures are electrically connected to form a current pathway on the front surface of the semiconductor chip.

In another aspect of the present disclosure, a semiconductor chip is provided. The semiconductor chip comprises: a semiconductor substrate; active devices, formed on the semiconductor substrate; a stack of dielectric layers, covering the semiconductor substrate and the active devices; interconnection elements, embedded in the stack of the dielectric layers and electrically connected to the active devices; pillar structures, formed on the stack of the dielectric layers, and respectively comprising a ground pillar and working pillars separated from and substantially parallel with a line portion of the ground pillar, wherein the active devices are electrically connected to the working pillars of the pillar structures through the interconnection elements; and dummy pillar structures, formed on the stack of the dielectric layers and located aside the pillar structures, wherein the ground pillars of the pillar structures and the dummy pillar structures are electrically connected to form a current pathway over the stack of the dielectric layers.

In yet another aspect of the present disclosure, a semiconductor chip is provided. The semiconductor chip comprises: a semiconductor substrate; active devices, formed on the semiconductor substrate within a central region of the semiconductor chip; a stack of dielectric layers, covering the semiconductor substrate and the active devices; interconnection elements, spreading in the stack of the dielectric layers and electrically connected to the active devices; pillar structures, formed on the stack of the dielectric layers within the central region of the semiconductor chip, and respectively comprising a ground pillar and working pillars separated from the ground pillar, wherein the active devices are electrically connected to the working pillars of the pillar structures through the interconnection elements; and dummy pillar structures, formed on the stack of the dielectric layers within a dummy region of the semiconductor chip laterally enclosing the central region of the semiconductor chip, wherein the ground pillars of the pillar structures and the dummy pillar structures are electrically connected to form a current pathway over the stack of the dielectric layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor chip, comprising:

a semiconductor substrate;

active devices, formed on the semiconductor substrate within a central region of the semiconductor chip;

a stack of dielectric layers, covering the semiconductor substrate and the active devices;

interconnection elements, spreading in the stack of the dielectric layers and electrically connected to the active devices;

pillar structures, formed on the stack of the dielectric layers within the central region of the semiconductor chip, and respectively comprising a ground pillar and working pillars separated from the ground pillar, wherein the active devices are electrically connected to the working pillars of the pillar structures through the interconnection elements; and dummy pillar structures, formed on the stack of the dielectric layers within a dummy region of the semiconductor chip laterally enclosing the central region of the semiconductor chip, wherein the ground pillars of the pillar structures and the dummy pillar structures are electrically connected to form a current pathway over the stack of the dielectric layers.

2. The semiconductor chip according to claim 1, wherein the semiconductor substrate has a recess at a back surface facing away from the stack of the dielectric layers, and the pillar structures as well as the dummy pillar structures overlap the recess of the semiconductor substrate.

3. A semiconductor chip, comprising:

a semiconductor substrate;

active devices, formed on the semiconductor substrate;

a stack of dielectric layers, covering the semiconductor substrate and the active devices;

interconnection elements, embedded in the stack of the dielectric layers and electrically connected to the active devices;

pillar structures, formed on the stack of the dielectric layers, and respectively comprising a ground pillar and working pillars separated from and substantially parallel with a line portion of the ground pillar, wherein the active devices are electrically connected to the working pillars of the pillar structures through the interconnection elements; and dummy pillar structures, formed on the stack of the dielectric layers and located aside the pillar structures, wherein the ground pillars of the pillar structures and the dummy pillar structures are electrically connected to form a current pathway over the stack of the dielectric layers.

4. The semiconductor chip according to claim 3, wherein the ground pillars of the pillar structures and the dummy pillar structures are electrically isolated from the interconnection elements.

5. The semiconductor chip according to claim 3, wherein the working pillars are shorter in height as compared to the ground pillars and the dummy pillar structures.

6. The semiconductor chip according to claim 3, wherein the working pillars and the ground pillars each have a bottom necking portion.

7. The semiconductor chip according to claim 3, further comprising conductive pads and a passivation layer formed on the stack of the dielectric layers, wherein the conductive pads are laterally surrounded by the passivation layer, and are electrically connected to the interconnection elements and the working pillars of the pillar structures.

8. The semiconductor chip according to claim 7, further comprising seed layers, stacked on the passivation layer, wherein the working pillars and the ground pillars of the pillar structures each stand one an island portion of the seed layers positioned on one of the conductive pads, and the dummy pillar structures stand on rest portion of the seed layers separated from the island portions of the seed layers.

9. The semiconductor chip according to claim 8, further comprising insulating patterns, each laterally enclosing one of the island portions of the seed layers.

10. A semiconductor chip, comprising:

an array of pillar structures, disposed on a front surface of the semiconductor chip, and respectively comprising a ground pillar and multiple working pillars laterally spaced apart from and substantially parallel with a line portion of the ground pillar, wherein active devices formed inside the semiconductor chip are electrically connected to the working pillars; and dummy pillar structures, disposed on the front surface of the semiconductor chip and laterally surrounding the pillar structures, wherein the ground pillars of the pillar structures and the dummy pillar structures are electrically connected to form a current pathway on the front surface of the semiconductor chip.

11. The semiconductor chip according to claim 1, wherein through holes extending from the front surface of the semiconductor chip to a back surface of the semiconductor chip are respectively arranged between one of the working pillars and the line portion of the ground pillar in one of the pillar structures.

12. The semiconductor chip according to claim 1, wherein the working pillars of the pillar structures are electrically isolated from the ground pillars of the pillar structures and the dummy pillar structures.

13. The semiconductor chip according to claim 1, further comprising electrical connectors placed on the front surface of the semiconductor chip along edges of the semiconductor chip.

14. The semiconductor chip according to claim 1, wherein each of the dummy pillar structures comprises:

a first pillar, with a line portion and laterally protruding portions separately extending from a single side of the line portion; and second pillars, extending between and separate from adjacent ones of the laterally protruding portions of the first pillar, and substantially parallel with the line portion of the first pillar.

15. The semiconductor chip according to claim 1, wherein the ground pillar in each pillar structure has the line portion and laterally protruding portions separately extending from a single side of the line portion.

16. The semiconductor chip according to claim 15, wherein the working pillars respectively extend between and separated from adjacent ones of the laterally protruding portions of one of the ground pillars.

17. The semiconductor chip according to claim 15, wherein through holes extending from the front surface of the semiconductor chip to a back surface of the semiconductor chip are each laterally surrounded by one of the working pillars and the ground pillar in one of the pillar structures.

18. The semiconductor chip according to claim 15, wherein each dummy pillar structure has a line portion and laterally protruding portions separately extending from a single side of the line portion.

19. The semiconductor chip according to claim 18, wherein an amount of the laterally protruding portions in each dummy pillar structure is greater than an amount of the laterally protruding portions in each ground pillar.

20. The semiconductor chip according to claim 19, wherein a spacing between adjacent ones of the laterally protruding portions in each dummy pillar structure is shorter than a spacing between adjacent ones of the laterally protruding portions in each ground pillar.

* * * * *